(12) United States Patent
Machida

(10) Patent No.: US 7,615,408 B2
(45) Date of Patent: Nov. 10, 2009

(54) METHOD OF MANUFACTURING SEMICONDUCTOR DEVICE

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/212,171

(22) Filed: Sep. 17, 2008

(65) Prior Publication Data

US 2009/0075422 A1 Mar. 19, 2009

(30) Foreign Application Priority Data

Sep. 18, 2007 (JP) ............................... 2007-241375

(51) Int. Cl.
*H01L 21/00* (2006.01)

(52) U.S. Cl. .................. 438/106; 438/107; 438/110; 438/124; 438/127; 257/E21.502; 257/E21.511

(58) Field of Classification Search .................. 438/106, 438/110, 121, 124, 126, 127; 257/E21.502, 257/E21.511
See application file for complete search history.

(56) References Cited

U.S. PATENT DOCUMENTS 5,960,308 A 9/1999 Akagawa et al.

| | | | |
|---|---|---|---|
| 7,091,620 B2* | 8/2006 | Miyazaki et al. | 257/778 |
| 7,396,700 B2* | 7/2008 | Hsu | 438/107 |
| 2002/0047215 A1* | 4/2002 | Akiyama et al. | 257/778 |
| 2003/0001286 A1* | 1/2003 | Kajiwara et al. | 257/778 |
| 2004/0115868 A1* | 6/2004 | Ono | 438/127 |
| 2006/0192294 A1 | 8/2006 | Lee | |
| 2008/0230897 A1 | 9/2008 | Machida | |

FOREIGN PATENT DOCUMENTS

| EP | 1 933 377 | 6/2008 |
|---|---|---|
| JP | 10-256306 | 9/1998 |
| JP | 2002-313985 | 10/2002 |

\* cited by examiner

*Primary Examiner*—Alexander G Ghyka
*Assistant Examiner*—Seahvosh J Nikmanesh
(74) *Attorney, Agent, or Firm*—Rankin, Hill & Clark LLP

(57) ABSTRACT

An internal connecting terminal 12 is formed on electrode pads 23 of a plurality of semiconductor chips 11 formed on a semiconductor substrate 35, and there is formed a resin member 13 having a resin member body 13-1 and a protruded portion 13-2 and covering the semiconductor chips 11 on which the internal connecting terminal 12 is formed, a metal layer 39 is formed on the resin member body 13-1 and the protruded portion 13-2 is used as an alignment mark to form a resist film 48 covering the metal layer 39 in a part corresponding to a region in which a wiring pattern 14 is formed and to then carry out etching over the metal layer 39 by using the resist layer 48 as a mask, thereby forming the wiring pattern 14 which is electrically connected to the internal connecting terminal 12.

10 Claims, 32 Drawing Sheets

METHOD OF MANUFACTURING SEMICONDUCTOR DEVICE

BACKGROUND OF THE INVENTION

The present invention relates to a method of manufacturing a semiconductor device, and more particularly to a method of manufacturing a semiconductor device including a semiconductor chip including an electrode pad, an internal connecting terminal provided on the electrode pad, and a wiring pattern which is electrically connected to the internal connecting terminal.

A conventional semiconductor device includes a semiconductor device (for example, see FIG. 1) referred to as a chip size package which includes a semiconductor chip including an electrode pad, an internal connecting terminal provided on the electrode pad, and a wiring pattern which is electrically connected to the internal connecting terminal, and has an almost equal size to the size of the semiconductor chip as seen on a plane.

FIG. 1 is a sectional view showing a conventional semiconductor device.

Referring to FIG. 1, a conventional semiconductor device 100 has a semiconductor chip 101, an internal connecting terminal 102, a resin layer 103, a wiring pattern 104, a solder resist 106, and an external connecting terminal 107.

The semiconductor chip 101 has a semiconductor substrate 110 formed like a thin plate, a semiconductor integrated circuit 111, a plurality of electrode pads 112, and a protective film 113. The semiconductor integrated circuit 111 is provided on a surface side of the semiconductor substrate 110. The semiconductor integrated circuit 111 is constituted by a diffusion layer, an insulating layer and a wiring pattern (not shown). The electrode pads 112 are provided on the semiconductor integrated circuit 111. The electrode pads 112 are electrically connected to a wiring pattern provided on the semiconductor integrated circuit 111. The protective film 113 is provided on the semiconductor integrated circuit 111. The protective film 113 serves to protect the semiconductor integrated circuit 111.

The internal connecting terminal 102 is provided on the electrode pad 112. An upper end of the internal connecting terminal 102 is exposed from the resin layer 103. The upper end of the internal connecting terminal 102 is connected to the wiring pattern 104. The resin layer 103 is provided to cover the semiconductor chip 101 on a side where the internal connecting terminal 102 is disposed.

The wiring pattern 104 is provided on the resin layer 103. The wiring pattern 104 is connected to the internal connecting terminal 102. The wiring pattern 104 is electrically connected to the electrode pad 112 through the internal connecting terminal 102. The wiring pattern 104 has a pad 104A provided with an external connecting terminal 107. The solder resist 106 is provided on the resin layer 103 to cover the wiring pattern 104 in a portion excluding the pad 104A.

FIGS. 2 to 10 are views showing a process for manufacturing the conventional semiconductor device. In FIGS. 2 to 10, the same components as those in the conventional semiconductor device 100 shown in FIG. 1 have the same reference numerals.

First of all, at a step shown in FIG. 2, there is formed the semiconductor chip 101 having the semiconductor integrated circuit 111, the electrode pads 112 and the protective film 113 on the surface side of the semiconductor substrate 110 which has not been formed into a thin plate. At a step shown in FIG. 3, next, the internal connecting terminal 102 is formed on the electrode pads 112. In this stage, the internal connecting terminals 102 have a variation in a height.

At a step shown in FIG. 4, subsequently, a flat plate 115 is pressed against the internal connecting terminals 102 to cause the heights of the internal connecting terminals 102 to be equal to each other. Consequently, upper surfaces 102A of the internal connecting terminals 102 are formed to be almost flat surfaces. At a step shown in FIG. 5, then, the resin layer 103 is formed to cover the semiconductor chip 101 on the side where the internal connecting terminal 102 is formed and the internal connecting terminal 102.

At a step shown in FIG. 6, next, the resin layer 103 is polished until the upper surface 102A of the internal connecting terminal 102 is exposed from the resin layer 103. At this time, the polishing is carried out in such a manner that an upper surface 103A of the resin layer 103 is almost on the level with the upper surface 102A of the internal connecting terminal 102. Consequently, an upper surface of the structure shown in FIG. 6 (more specifically, the upper surface 103A of the resin layer 103 and the upper surface 102A of the internal connecting terminal 102) is flat.

At a step shown in FIG. 7, then, the wiring pattern 104 is formed on the upper surface of the structure illustrated in FIG. 6 which is flat. More specifically, a metal foil (not shown) is stuck to the upper surface of the structure shown in FIG. 6 and a resist (not shown) is then applied to cover the metal foil, and subsequently, the resist is exposed and developed to form a resist film (not shown) on the metal foil in a part corresponding to the region in which the wiring pattern 104 is formed. Thereafter, the metal foil is etched by using the resist film as a mask so that the wiring pattern 104 is formed (a subtractive method). Then, the resist film is removed. An exposing region of the resist is determined by detecting a position of an alignment mark (not shown) formed on the semiconductor integrated circuit 111 through an exposing device (not shown) having infrared rays or an X-ray transmitting function.

At a step shown in FIG. 8, subsequently, the solder resist 106 covering the wiring pattern 104 in a portion other than the pad 104A is formed on the resin layer 103.

At a step shown in FIG. 9, next, the semiconductor substrate 110 is polished from the back side of the semiconductor substrate 110 so that the semiconductor substrate 110 is made thin. At a step shown in FIG. 10, then, the external connecting terminal 107 is formed on the pad 104A. Consequently, the semiconductor device 100 is manufactured (for example, see Patent Document 1).

[Patent Document 1] Japanese Patent No. 3614828

In the method of manufacturing the conventional semiconductor device 100, however, it is necessary to provide the step of causing the heights of the internal connecting terminals 102 to be equal to each other and the step of polishing the resin layer 103 to expose the upper surfaces 102A of the internal connecting terminals 102 from the resin layer 103. For this reason, there is a problem in that a manufacturing cost of the semiconductor device 100 is increased with an increase in the number of the steps.

Moreover, the exposing device having the infrared rays or X-ray transmitting function which is to be used in the formation of the resist film for forming the wiring pattern 104 is expensive. For this reason, there is a problem in that the manufacturing cost of the semiconductor device 100 is increased.

In the case in which the exposing device having the infrared rays or X-ray transmitting function is used, furthermore, precision in the detection of the alignment mark is not sufficient. For this reason, there is a problem in that precision in the position of the wiring pattern 104 with respect to the internal connecting terminal 102 is reduced.

SUMMARY OF THE INVENTION

In consideration of the problems, therefore, it is an object of the invention to provide a method of manufacturing a semiconductor device which can reduce a manufacturing cost of the semiconductor device and can enhance precision in a position of a wiring pattern with respect to an internal connecting terminal.

According to a first aspect of the invention, there is provided a method of manufacturing a semiconductor device including a plurality of semiconductor chips including an electrode pad, a semiconductor substrate having a plurality of semiconductor chip forming regions in which the semiconductor chips are formed, an internal connecting terminal provided on the electrode pad, and a wiring pattern which is electrically connected to the internal connecting terminal, the method including the steps of:

forming the internal connecting terminal on the electrode pads of the semiconductor chips;

preparing a support plate having a metal layer in which a metal layer to be a base material of the wiring pattern is provided on a support plate;

forming a penetrating portion on the support plate having a metal layer in a part opposite to the semiconductor chips;

forming a conductive terminal on the metal layer in a part opposite to the internal connecting terminal;

disposing the semiconductor chips and the support plate having a metal layer opposite to each other in such a manner that the internal connecting terminal and the conductive terminal are opposed to each other and pressing the support plate having a metal layer to pressure bond the internal connecting terminal to the metal layer;

sealing a portion between the semiconductor chips and the support plate having a metal layer and the penetrating portion with a resin after the pressure bonding step;

removing the support plate and forming a protruded portion on the resin in a part corresponding to the penetrating portion of the support plate after the sealing step;

forming a resist film covering the metal layer in a part corresponding to a region in which the wiring pattern is formed by using the protruded portion as an alignment mark; and etching the metal layer by using the resist film as a mask to form the wiring pattern.

According to a second aspect of the invention, there is provided the method of manufacturing a semiconductor device according to the first aspect, wherein at least two penetrating portions are formed in the penetrating portion forming step.

According to a third aspect of the invention, there is provided the method of manufacturing a semiconductor device according to the first or second aspect, wherein the penetrating portion is formed on the support plate having a metal layer in a part corresponding to a region other than the region in which the wiring pattern is formed in the penetrating portion forming step.

According to a forth aspect of the invention, there is provided the method of manufacturing a semiconductor device according to any one of the first to third aspects, wherein the penetrating portion formed on the support plate having a metal layer is used as the alignment mark to dispose the semiconductor chips and the support plate having a metal layer opposite to each other in the pressure bonding step.

According to a fifth aspect of the invention, there is provided the method of manufacturing a semiconductor device according to any one of the first to forth aspects, wherein the resin is formed by a transfer mold method in the sealing step.

According to the invention, the internal connecting terminal is formed on the electrode pads of the semiconductor chips, a penetrating portion is formed on the support plate having a metal layer in which the metal layer to be the base material of the wiring pattern is provided on the support plate, a conductive terminal is thereafter formed on the metal layer in an opposed part to the internal connecting terminal, the semiconductor chips and the support plate having a metal layer are subsequently disposed opposite to each other in such a manner that the internal connecting terminal and the conductive terminal are opposed to each other, and the support plate having a metal layer is pressed to pressure bond the internal connecting terminal to the metal layer, and a portion between the semiconductor chips and the support plate having a metal layer and the penetrating portion are then sealed with a resin. Therefore, it is not necessary to provide a step of causing heights of the internal connecting terminals to be equal to each other and a resin polishing step of exposing the internal connecting terminal in a part connected to the wiring pattern from the resin. Consequently, it is possible to decrease the number of the steps. Thus, it is possible to reduce a manufacturing cost of the semiconductor device.

Moreover, the support plate is removed and a protruded portion is formed on the resin in a corresponding part to the penetrating portion of the support plate after the sealing step, the protruded portion is then used as an alignment mark to form a resist film covering the metal layer in a corresponding part to a region in which the wiring pattern is formed, and the metal layer is thereafter etched by using the resist film as a mask, thereby forming the wiring pattern. Consequently, it is possible to enhance precision in the position in which the wiring pattern is formed with respect to the internal connecting terminal.

When forming the resist film, furthermore, it is possible to detect the position of the protruded portion to be the alignment mark by using an inexpensive exposing device including a CCD camera. Therefore, it is possible to reduce the manufacturing cost of the semiconductor device.

According to a sixth aspect of the invention, there is provided a method of manufacturing a semiconductor device including a plurality of semiconductor chips including an electrode pad, a semiconductor substrate having a plurality of semiconductor chip forming regions in which the semiconductor chips are formed, an internal connecting terminal provided on the electrode pad, and a wiring pattern which is electrically connected to the internal connecting terminal, the method including the steps of:

forming the internal connecting terminal on the electrode pads of the semiconductor chips;

preparing a support plate having a metal layer in which the metal layer is provided on the support plate;

forming a penetrating portion on the support plate having a metal layer in a part opposite to the semiconductor chips;

forming a conductive terminal on the metal layer in a part opposite to the internal connecting terminal;

disposing the semiconductor chips and the support plate having a metal layer opposite to each other in such a manner that the internal connecting terminal and the conductive terminal are opposed to each other and pressing the support plate having a metal layer to pressure bond the internal connecting terminal to the metal layer;

sealing a portion between the semiconductor chips and the support plate having a metal layer and the penetrating portion with a resin after the pressure bonding step;

removing the support plate and forming a protruded portion on the resin in a part corresponding to the penetrating portion of the support plate after the sealing step;

forming a resist film having an opening portion in a part corresponding to a region in which the wiring pattern is formed on the metal layer by using the protruded portion as an alignment mark;

forming a plated film on the metal layer in an exposed part to the opening portion by an electrolytic plating method using the metal layer as a feeding layer;

removing the resist film after the plated film forming step; and removing the metal layer in a part in which the plated film is not formed to form the wiring pattern constituted by the metal layer and the plated film.

According to a seventh aspect of the invention, there is provided the method of manufacturing a semiconductor device according to the sixth aspect, wherein at least two penetrating portions are formed in the penetrating portion forming step.

According to an eighth aspect of the invention, there is provided the method of manufacturing a semiconductor device according to the sixth or seventh aspect, wherein the penetrating portion is formed on the support plate having a metal layer in a part corresponding to a region other than the region in which the wiring pattern is formed in the penetrating portion forming step.

According to a ninth aspect of the invention, there is provided the method of manufacturing a semiconductor device according to any one of the sixth to eighth aspects, wherein the penetrating portion formed on the support plate having a metal layer is used as the alignment mark to dispose the semiconductor chips and the support plate having a metal layer opposite to each other in the pressure bonding step.

According to a tenth aspect of the invention, there is provided the method of manufacturing a semiconductor device according to any one of the sixth to ninth aspects, wherein the resin is formed by a transfer mold method in the sealing step.

According to the invention, the internal connecting terminal is formed on the electrode pads of the semiconductor chips, a penetrating portion is formed on the support plate having a metal layer in which the metal layer to be the base material of the wiring pattern is provided on the support plate, and a conductive terminal is thereafter formed on the metal layer in an opposed part to the internal connecting terminal, the semiconductor chips and the support plate having a metal layer are subsequently disposed opposite to each other in such a manner that the internal connecting terminal and the conductive terminal are opposed to each other, and the support plate having a metal layer is pressed to pressure bond the internal connecting terminal to the conductive terminal, and a portion between the semiconductor chips and the support plate having a metal layer and the penetrating portion are then sealed with a resin. Therefore, it is not necessary to provide a step of causing heights of the internal connecting terminals to be equal to each other and a resin polishing step of exposing the internal connecting terminal in a portion connected to the wiring pattern from the resin. Consequently, it is possible to decrease the number of the steps. Thus, it is possible to reduce a manufacturing cost of the semiconductor device.

Moreover, the support plate is removed and a protruded portion is formed on the resin in a corresponding part to the penetrating portion of the support plate after the sealing step, the protruded portion is then used as an alignment mark to form a resist film having an opening portion in a corresponding part to a region in which the wiring pattern is formed on the metal layer, and a plated film is subsequently formed on the metal layer in an exposed part to the opening portion through an electrolytic plating method using the metal layer as a feeding layer, the resist film is then removed, and the metal layer in a part in which the plated film is not formed is thereafter removed to form the wiring pattern constituted by the metal layer and the plated film. Consequently, it is possible to enhance precision in a position in which the wiring pattern is formed with respect to the internal connecting terminal.

When forming the resist film, furthermore, it is possible to detect the position of the protruded portion to be the alignment mark by using an inexpensive exposing device including a CCD camera. Therefore, it is possible to reduce the manufacturing cost of the semiconductor device.

According to the invention, it is possible to reduce a manufacturing cost of the semiconductor device, and furthermore, to enhance precision in a position in which the wiring pattern is formed with respect to the internal connecting terminal.

DETAILED DESCRIPTION OF THE PREFERRED EMBODIMENTS

Next, an embodiment according to the invention will be described with reference to the drawings.

First Embodiment

Figure 1:
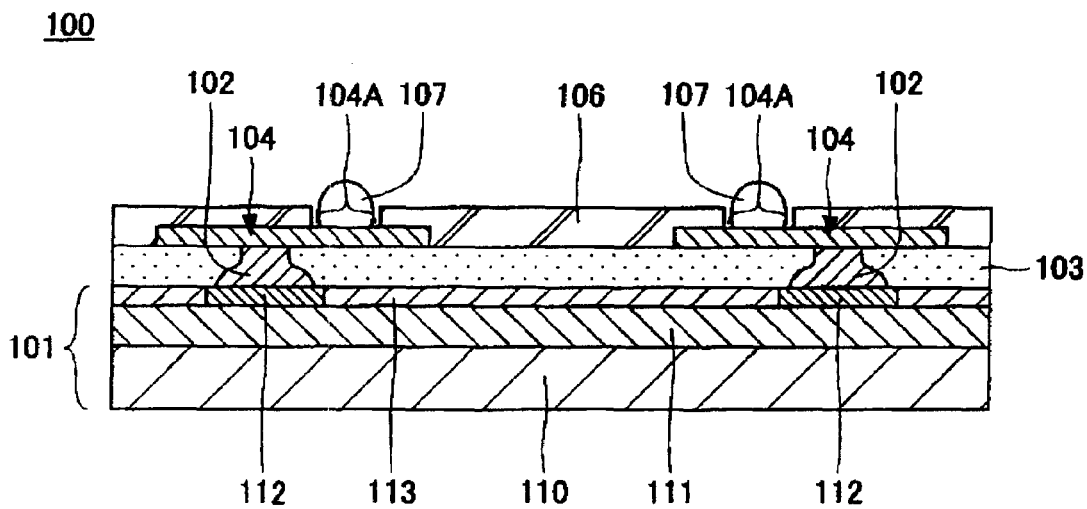
FIG. 1 is a sectional view showing a conventional semiconductor device.
Figure 2:
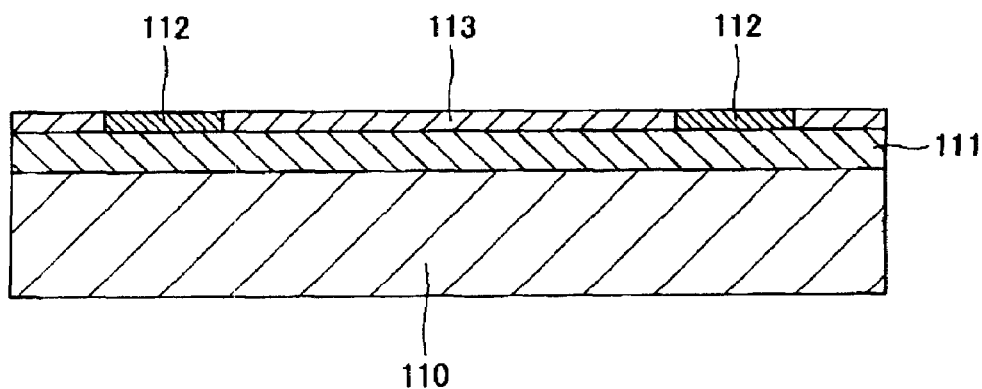
FIG. 2 is a view (No. 1) showing a step of manufacturing the conventional semiconductor device.
Figure 3:
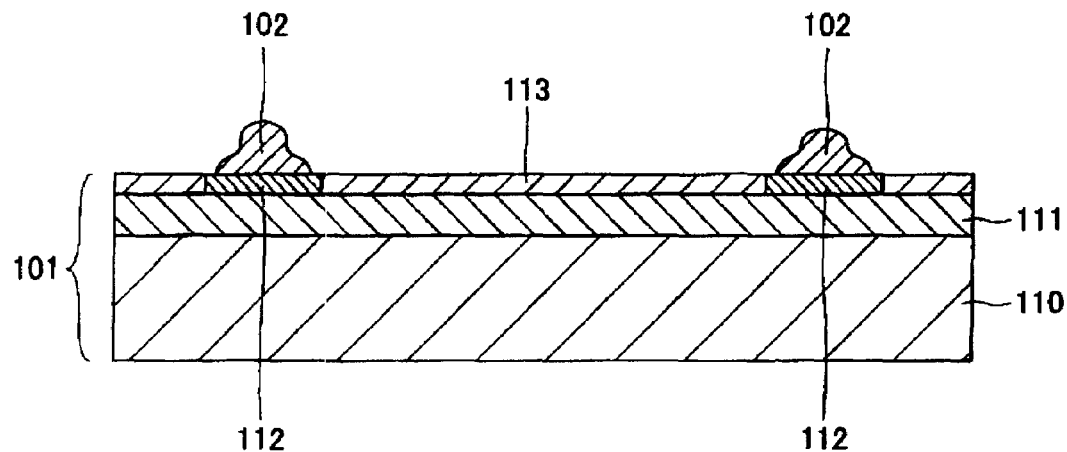
FIG. 3 is a view (No. 2) showing the step of manufacturing the conventional semiconductor device.
Figure 4:
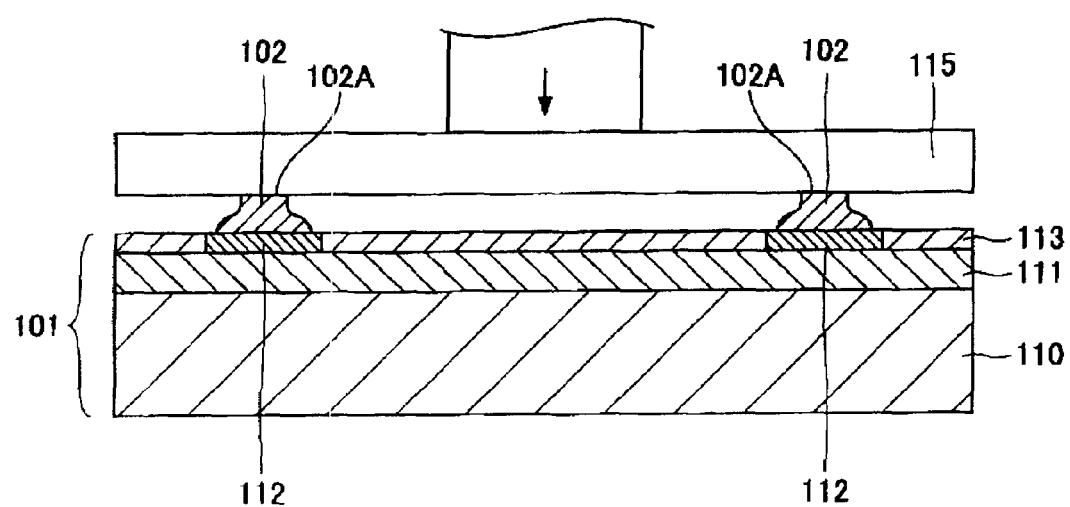
FIG. 4 is a view (No. 3) showing the step of manufacturing the conventional semiconductor device.
Figure 5:
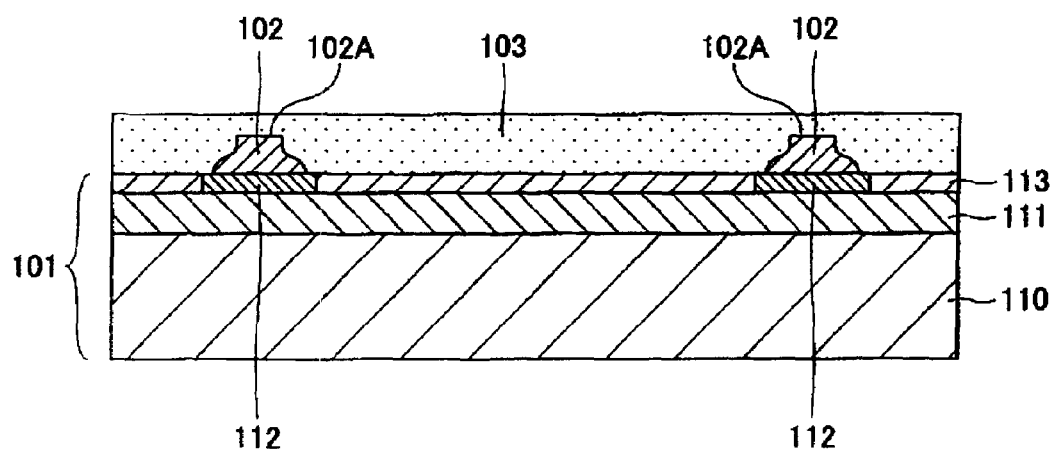
FIG. 5 is a view (No. 4) showing the step of manufacturing the conventional semiconductor device.
Figure 6:
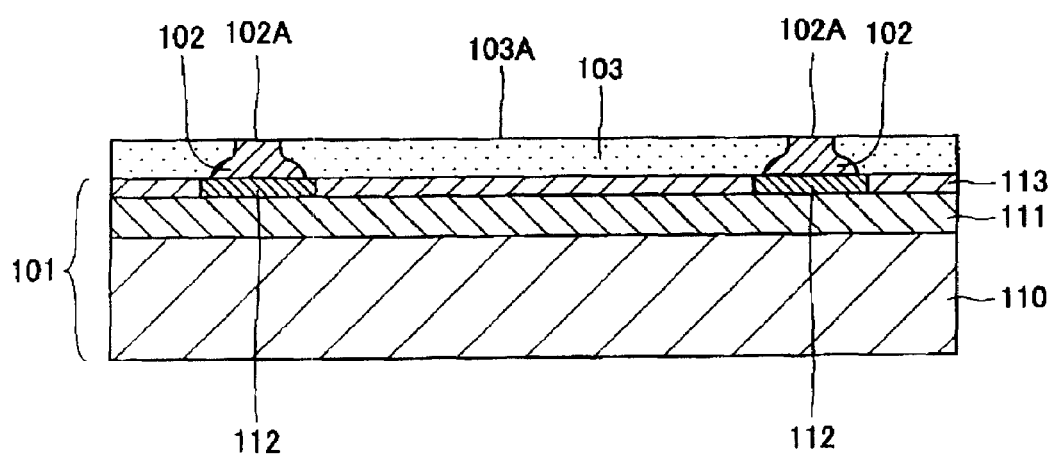
FIG. 6 is a view (No. 5) showing the step of manufacturing the conventional semiconductor device.
Figure 7:
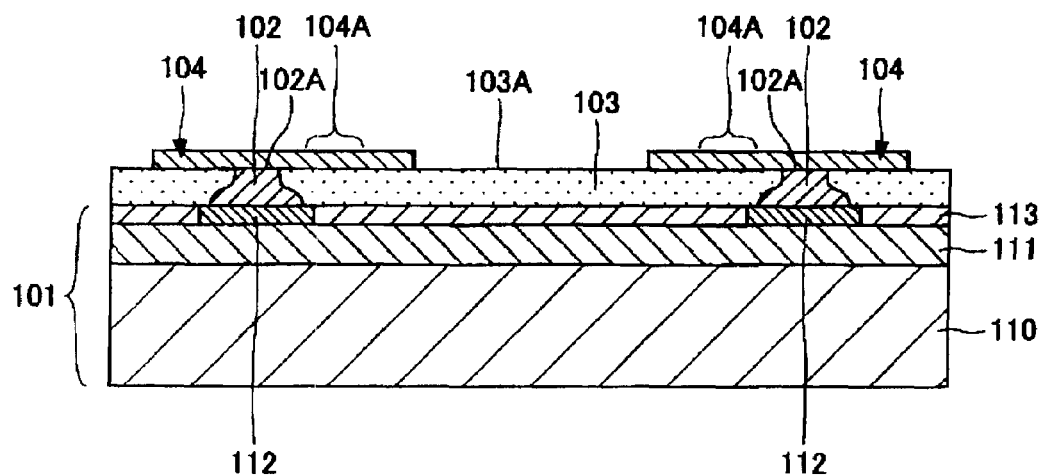
FIG. 7 is a view (No. 6) showing the step of manufacturing the conventional semiconductor device.
Figure 8:
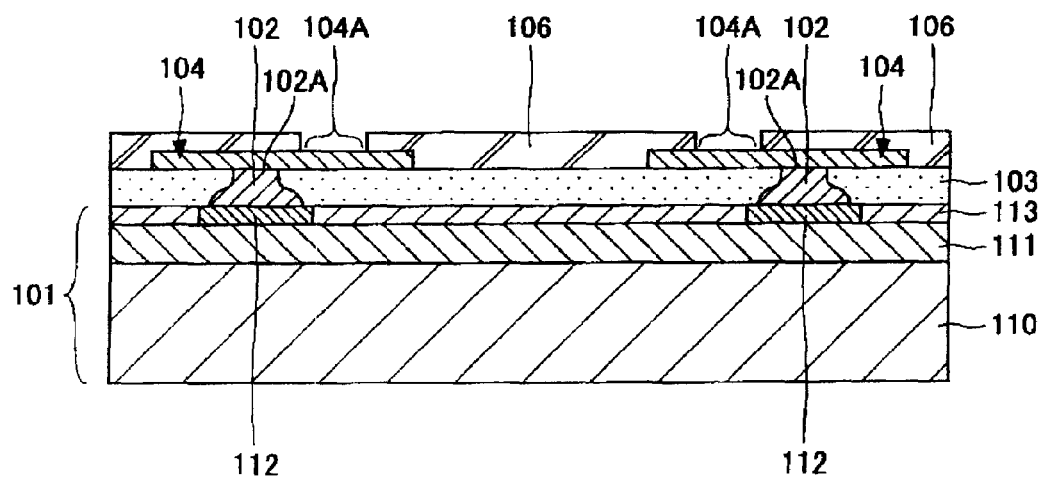
FIG. 8 is a view (No. 7) showing the step of manufacturing the conventional semiconductor device.
Figure 9:
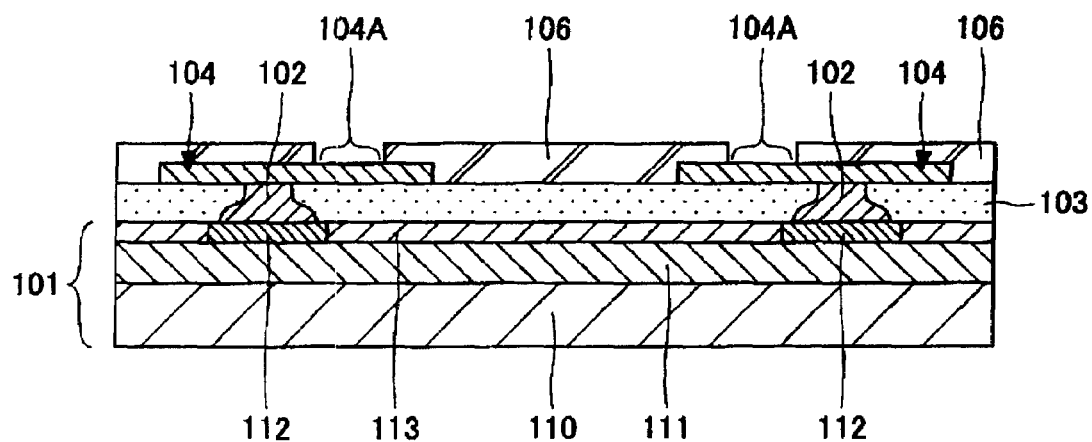
FIG. 9 is a view (No. 8) showing the step of manufacturing the conventional semiconductor device.
Figure 10:
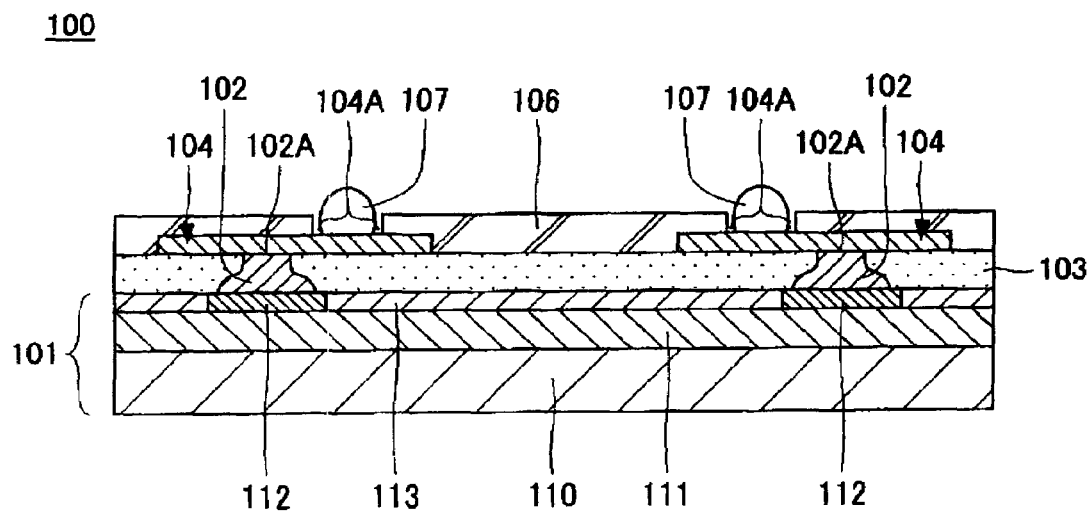
FIG. 10 is a view (No. 9) showing the step of manufacturing the conventional semiconductor device.
Figure 11:
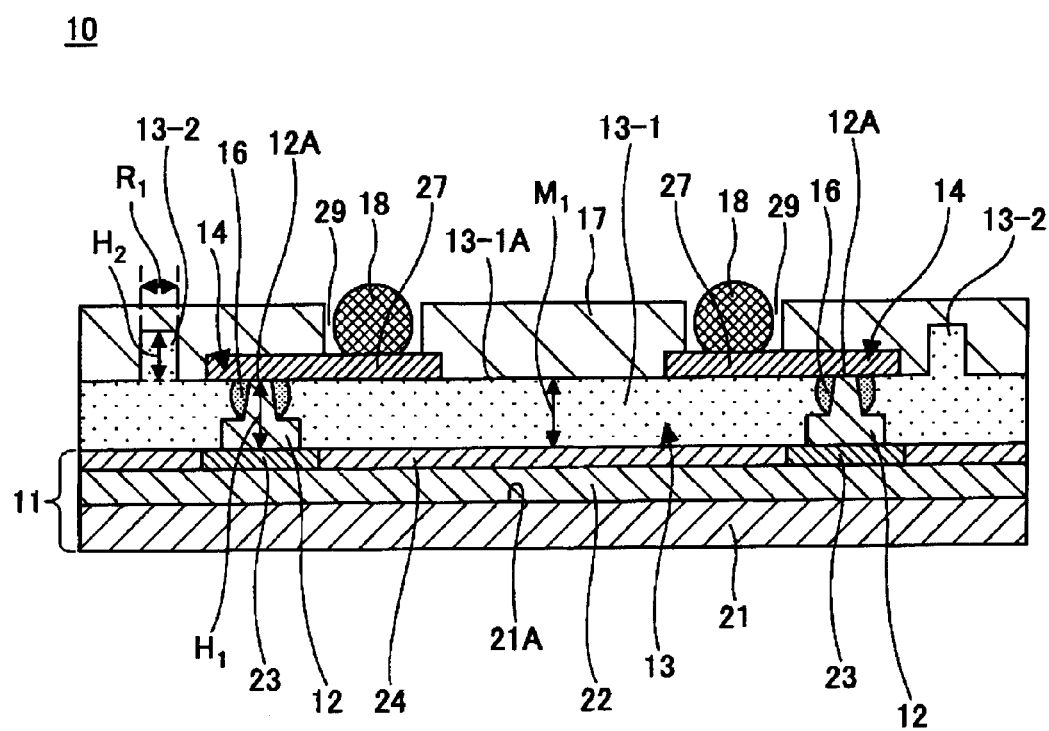
FIG. 11 is a sectional view showing a semiconductor device according to a first embodiment of the invention.

FIG. 11 is a sectional view showing a semiconductor device according to a first embodiment of the invention.

Referring to FIG. 11, a semiconductor device 10 according to the first embodiment includes a semiconductor chip 11, an internal connecting terminal 12, a resin member 13, a wiring pattern 14, a conductive terminal 16, a solder resist 17, and an external connecting terminal 18.

The semiconductor chip 11 includes a semiconductor substrate 21, a semiconductor integrated circuit 22, an electrode pad 23 and a protective film 24. The semiconductor substrate 21 serves to form the semiconductor integrated circuit 22 and is made thin. For the semiconductor substrate 21, it is possible to use a substrate formed of silicon, for example. The semiconductor substrate 21 can be set to have a thickness of 100 μm to 300 μm, for example.

The semiconductor integrated circuit 22 is provided on a surface 21A side of the semiconductor substrate 21. The semiconductor integrated circuit 22 is constituted by a diffusion layer (not shown) formed on the semiconductor substrate 21, an insulating layer (not shown) laminated on the semiconductor substrate 21 and a wiring pattern (not shown) provided on the laminated insulating layer and connected electrically to the diffusion layer (not shown).

A plurality of electrode pads 23 is provided on the semiconductor integrated circuit 22. The electrode pad 23 is electrically connected to the wiring pattern (not shown) provided on the semiconductor integrated circuit 22. As a material of the electrode pad 23, for example, it is possible to use Al or an Al alloy (such as an Al—Si—Cu alloy).

The protective film 24 is provided on the semiconductor integrated circuit 22. The protective film 24 serves to protect the semiconductor integrated circuit 22. For the protective film 24, it is possible to use an SiN film or a PSG film, for example.

The internal connecting terminal 12 is provided on the electrode pad 23. The internal connecting terminal 12 serves to electrically connect the semiconductor integrated circuit 22 to the wiring pattern 14. An upper surface 12A of the upper end of the internal connecting terminal 12 is almost flat. The upper surface 12A of the upper end of the internal connecting terminal 12 is provided in contact with a lower surface of the wiring pattern 14. Consequently, the electrode pad 23 is electrically connected to the wiring pattern 14. Moreover, the upper surface 12A of the upper end of the internal connecting terminal 12 is on almost the level with an upper surface 13-1A of a resin member body 13-1 (one of components of the resin member 13) which will be described below. The internal connecting terminal 12 can be set to have a height $H_1$ of 30 μm to 50 μm, for example.

For the internal connecting terminal 12, it is possible to use a metal film constituted by an Au bump, an Au plated film, an Ni film formed by a nonelectrolytic plating method, and an Au film covering the Ni film, for example. In the case in which the Au bump is used as the internal connecting terminal 12, the internal connecting terminal 12 can be formed by a bonding method or a plating method, for example.

Figure 12:
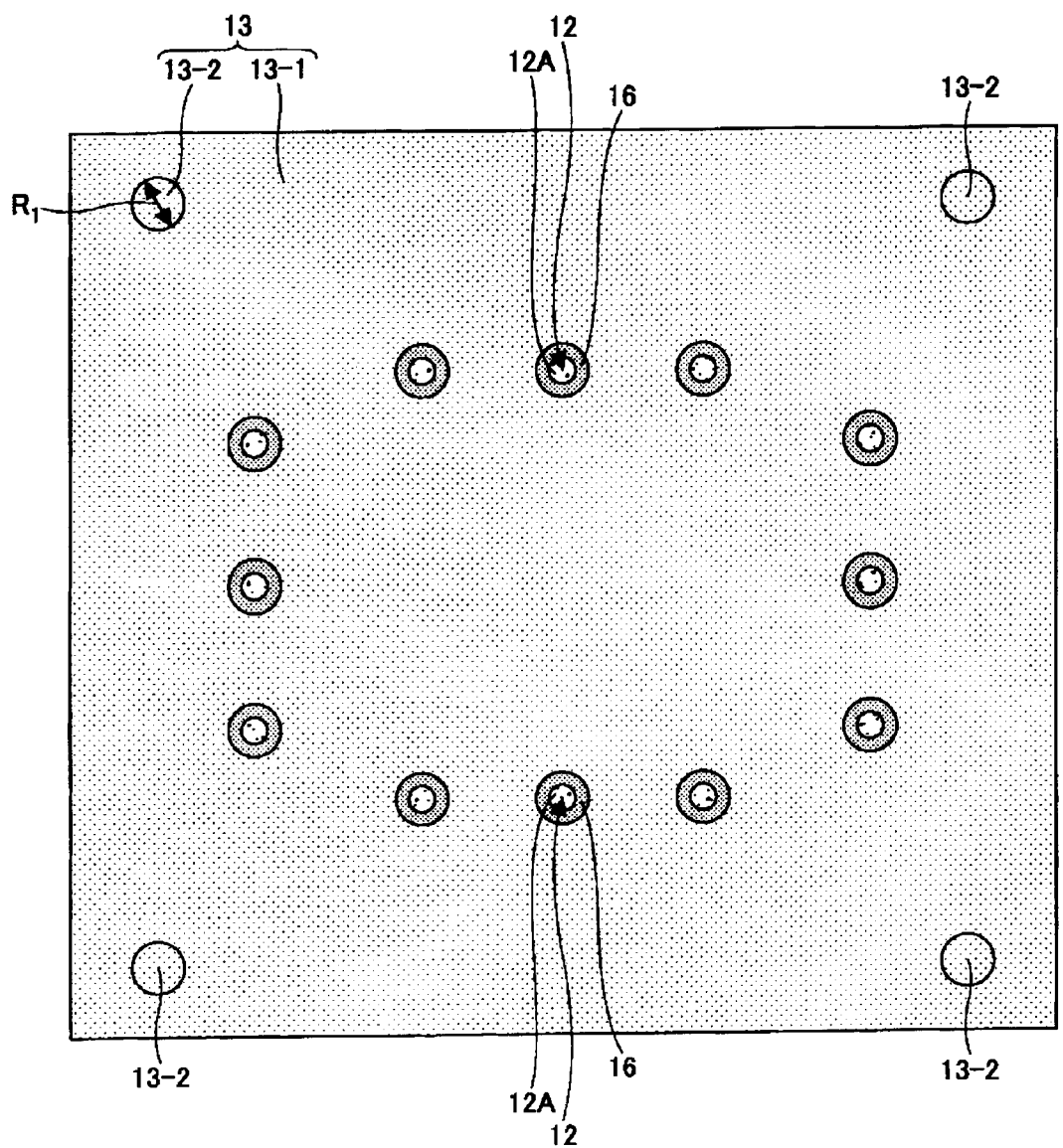
FIG. 12 is a plan view for explaining a resin member provided in the semiconductor device illustrated in FIG. 11.

FIG. 12 is a plan view for explaining the resin member provided in the semiconductor device illustrated in FIG. 11. In FIG. 12, the same components as those of the semiconductor device 10 illustrated in FIG. 11 have the same reference numerals.

With reference to FIGS. 11 and 12, the resin member 13 has the resin member body 13-1 and a protruded portion 13-2. The resin member body 13-1 is provided to cover a side surface of the internal connecting terminal 12, an upper surface of the electrode pad 23 in a portion in which the internal connecting terminal 12 is not provided, and an upper surface of the protective film 24. The resin member body 13-1 takes a square shape seen on a plane. An upper surface 13-1A of the resin member body 13-1 is almost flat. The upper surface 13-1A of the resin member body 13-1 is almost on the level with the upper surface 12A of the upper end of the internal connecting terminal 12. The wiring pattern 14 is formed on the upper surface 13-1A of the resin member body 13-1. The resin member body 13-1 in a portion disposed between the solder resist 17 and the protective film 24 can be set to have a thickness $M_1$ of 30 μm to 50 μm, for example.

The protruded portion 13-2 takes a cylindrical shape and is provided on the upper surface 13-1A of the resin member body 13-1. The protruded portions 13-2 are disposed one by one in the vicinity of four corner portions of the resin member body 13-1. The protruded portion 13-2 is a member to be used as an alignment mark in a processing of exposing a resist film for patterning the wiring pattern 14 which will be described below. The protruded portion 13-2 can be set to have a diameter $R_1$ of 100 μm, for example. Moreover, the protruded portion 13-2 can be set to have a height $H_2$ of 50 μm, for example. For the resin member 13 having the structure, it is possible to use an underfill resin or a mold resin (for example, an epoxy resin), for example.

By providing the protruded portion 13-2 on the upper surface 13-1A of the resin member body 13-1 on which the wiring pattern 14 is formed, thus, it is possible to use the protruded portion 13-2 as the alignment mark when executing the processing of exposing a resist film for patterning a metal layer to be a base material of the wiring pattern 14 (a metal layer formed on the upper surface 13-1A of the resin member body 13-1). Consequently, it is possible to enhance precision in a resist film forming position more greatly than that in the conventional art. Therefore, it is possible to enhance the precision in the position in which the wiring pattern 14 is formed with respect to the internal connecting terminal 12.

The wiring pattern 14 is provided on the upper surface 13-1A of the resin member body 13-1 to come in contact with the upper surface 12A of the upper end of the internal connecting terminal 12. The wiring pattern 14 is electrically connected to the semiconductor integrated circuit 22 through the internal connecting terminal 12. The wiring pattern 14 has a pad portion 27. The pad portion 27 serves to provide the external connecting terminal 18 thereon and is disposed in a position placed apart from the internal connecting terminal 12. For the wiring pattern 14, it is possible to use a Cu film, for example. In the case in which the Cu film is used as the wiring pattern 14, the wiring pattern 14 can be set to have a thickness of 12 μm, for example.

The conductive terminal 16 is provided on a lower surface of the wiring pattern 14 in an opposed part to the internal connecting terminal 12. The conductive terminal 16 is disposed to cover a side surface of the upper end of the internal connecting terminal 12. The conductive terminal 16 serves to fix the internal connecting terminal 12 to the wiring pattern 14. For the conductive terminal 16, it is possible to use a conductive paste (more specifically, for example, an Ag paste or a Cu paste) or a bump (more specifically, for example, an Au bump or a Cu bump), for instance.

The solder resist 17 is provided on the resin member 13 to cover the wiring pattern 14 in a portion excluding the pad portion 27 and the protruded portion 13-2. The solder resist 17 has an opening portion 29 for exposing the pad portion 27 therefrom.

The external connecting terminal 18 is provided on the pad portion 27. The external connecting terminal 18 is connected to an external connecting pad (not shown) provided on a mounting board (not shown) such as a mother board. For the external connecting terminal 18, it is possible to use a solder bump, for example.

According to the semiconductor device in accordance with the embodiment, the protruded portion 13-2 is provided on the upper surface 13-1A of the resin member body 13-1 on which the wiring pattern 14 is formed. Consequently, it is possible to use the protruded portion 13-2 as the alignment mark when executing the processing of exposing the resist film for patterning the metal layer to be the base material of the wiring pattern 14 (the metal layer formed on the upper surface 13-1A of the resin member body 13-1). Consequently, it is possible to enhance the precision in the resist film forming position more greatly than that in the conventional art. Therefore, it is possible to enhance the precision in the position in which the wiring pattern 14 is formed with respect to the internal connecting terminal 12.

When forming the resist film (not shown) for patterning the metal layer to be the base material of the wiring pattern 14 (the metal layer formed on the upper surface 13-1A of the resin member body 13-1), moreover, it is possible to detect the protruded portion 13-2 to be the alignment mark by using an inexpensive exposing apparatus (not shown) including a CCD camera (not shown). Therefore, it is possible to reduce a manufacturing cost of the semiconductor device 10.

While the description is given by taking, as an example, the case in which the four protruded portions 13-2 are provided in the corner portions of the resin member body 13-1 taking the square shape seen on a plane in the embodiment, the four protruded portions 13-2 may be provided on the resin member body 13-1 in a corresponding part to a region other than the wiring pattern forming region in which the wiring pattern 14 is formed. In this case, it is possible to produce the same advantages as those in the semiconductor device 10 according to the embodiment.

Although the description is given by taking, as an example, the case in which the four protruded portions 13-2 are provided in the embodiment, moreover, it is sufficient that at least two protruded portions 13-2 are provided. Also in this case, it is possible to produce the same advantages as those in the semiconductor device 10 according to the embodiment.

FIGS. 13 to 27 are views showing a process for manufacturing the semiconductor device according to the first embodiment of the invention. FIG. 28 is a plan view for explaining a penetrating portion formed on a support having a metal layer. In FIGS. 13 to 28, the same components as those in the semiconductor device 10 according to the first embodiment have the same reference numerals. In FIGS. 18 to 27, moreover, B denotes a region in which the semiconductor device 10 is formed (which will be hereinafter referred to as a "semiconductor device forming region B") and C denotes a position in which a semiconductor substrate 35 is cut when dividing the semiconductor devices 10 into individual pieces (which will be hereinafter referred to as a "cutting position C").

With reference to FIGS. 13 to 28, description will be given to a method of manufacturing the semiconductor device according to the first embodiment. First of all, at the step shown in FIG. 13, a plurality of semiconductor chips 11 having a semiconductor integrated circuit 22, an electrode pad 23 and a protective film 24 is formed on a semiconductor substrate 35 having a plurality of semiconductor chip forming regions, and an internal connecting terminal 12 is then formed on the electrode pad 23 (an internal connecting terminal forming step). The semiconductor substrate 35 is cut and divided into individual pieces at a step shown in FIG. 27 which will be described below and thus serves as the semiconductor substrate 21 described with reference to FIG. 11. For the semiconductor substrate 35, it is possible to use an Si wafer, for example. The semiconductor substrate 35 can be set to have a thickness of 500 µm to 775 µm, for example. For a material of the electrode pad 23, it is possible to use Al or an Al alloy (for example, an Al—Si—Cu alloy). For the protective film 24, it is possible to use an SiN film or a PSG film, for example.

For the internal connecting terminal 12, it is possible to use a metal film constituted by an Au bump, an Au plated film, an Ni film formed by a nonelectrolytic plating method, and an Au film covering the Ni film, for example. In the case in which the Au bump is used as the internal connecting terminal 12, the internal connecting terminal 12 can be formed by a bonding method or a plating method, for example. In this stage, the internal connecting terminals 12 have a variation in a height. In this stage, moreover, the upper surface of the upper end of the internal connecting terminal 12 is not flat.

Figure 14:
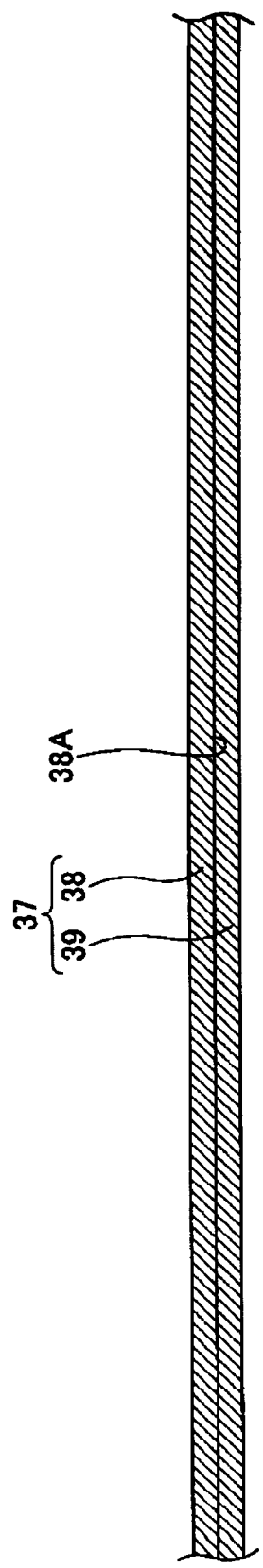
FIG. 14 is a view (No. 2) showing the step of manufacturing the semiconductor device according to the first embodiment of the invention.

At a step shown in FIG. 14, subsequently, there is prepared a support plate 37 having a metal layer in which a metal layer 39 to be the base material of the wiring pattern 14 is stuck to a surface 38A of a support plate 38 (a step of preparing a support plate having a metal layer). The metal layer 39 is stuck to the support plate 38 in a state in which it can be peeled from the support plate 38. It is sufficient that the support plate 38 is a plate member capable of supporting the metal layer 39 and can easily be separated. More specifically, it is possible to use a metal plate (for example, a Cu plate), a metal foil (for example, a Cu foil) and a resin plate for the support plate 38, for example. In the case in which the Cu foil is used for the support plate 38, the support plate 38 can be set to have a thickness of 35 µm, for example. For the metal layer 39, it is possible to use the Cu layer, for example. In the case in which the Cu layer is used for the metal layer 39, the metal layer 39 can be set to have a thickness of 12 µm, for example.

Figure 13:
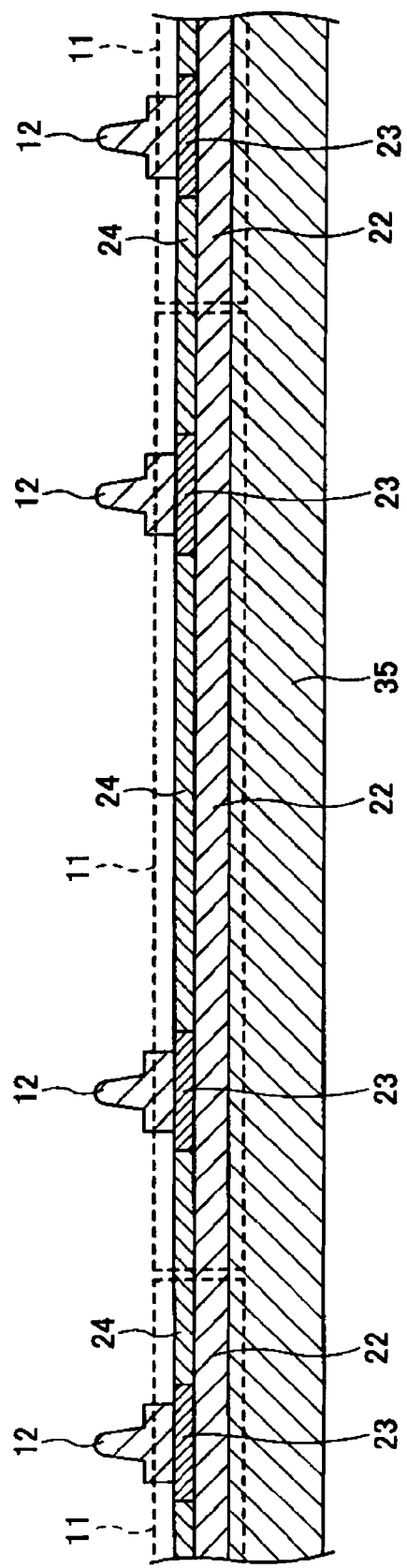
FIG. 13 is a view (No. 1) showing a step of manufacturing the semiconductor device according to the first embodiment of the invention.
Figure 15:
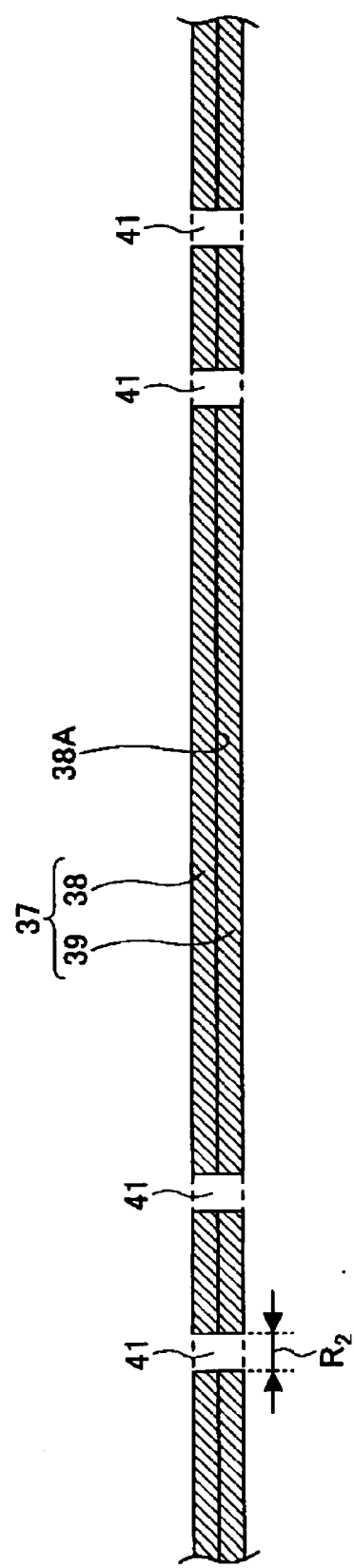
FIG. 15 is a view (No. 3) showing the step of manufacturing the semiconductor device according to the first embodiment of the invention.

At a step shown in FIG. 15, next, a penetrating portion 41 is formed on the support plate 37 having a metal layer in an opposed part to a semiconductor chip 11 shown in FIG. 13 (a penetrating portion forming step). As shown in FIG. 28, the penetrating portion 41 is formed on each support plate 37 having a metal layer in opposed parts of four corner portions in an external position A of the semiconductor chip 11 taking a square shape seen on a plane, for example. The penetrating portion 41 can be formed by a method such as a router processing, drilling or pressing, for example. For the shape of the penetrating portion 41, moreover, it is possible to use a shape of a cylinder, a square pole or a slit (a trench) (In FIG. 15, the penetrating portion 41 taking a cylindrical shape is shown by taking an example.) In the case in which the penetrating portion 41 takes a cylindrical shape, the penetrating portion 41 can be set to have a diameter $R_2$, for example, 100 µm.

Figure 16:
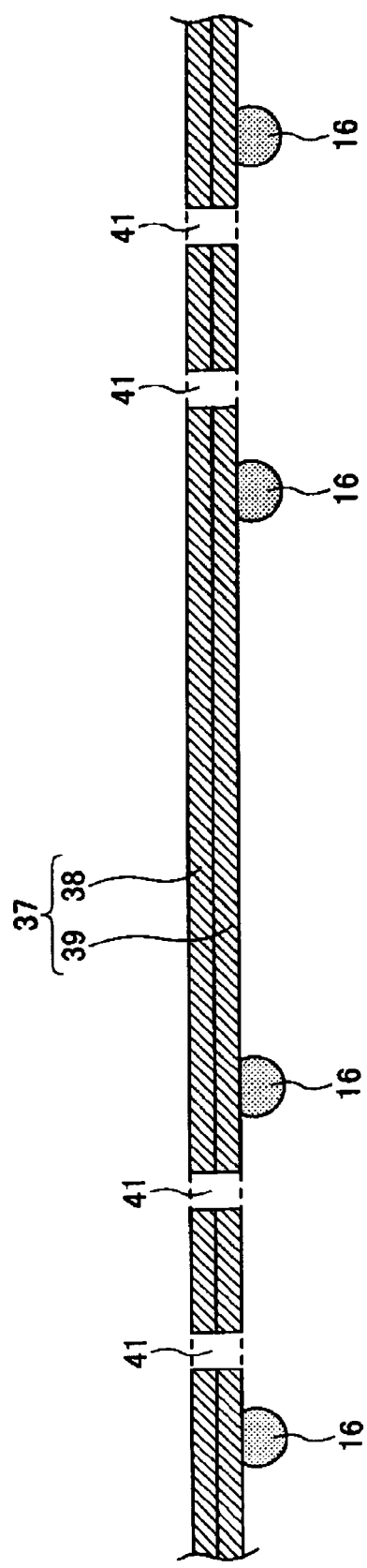
FIG. 16 is a view (No. 4) showing the step of manufacturing the semiconductor device according to the first embodiment of the invention.

At a step shown in FIG. 16, then, a conductive terminal 16 is formed on the metal layer 39 in the opposed part to the internal connecting terminal 12 provided in the structure shown in FIG. 13 (a conductive terminal forming step). For the conductive terminal 16, it is possible to use a conductive paste (more specifically, for example, an Ag paste or a Cu paste) or a bump (more specifically, for example, an Au bump or a Cu bump), for example.

Figure 17:
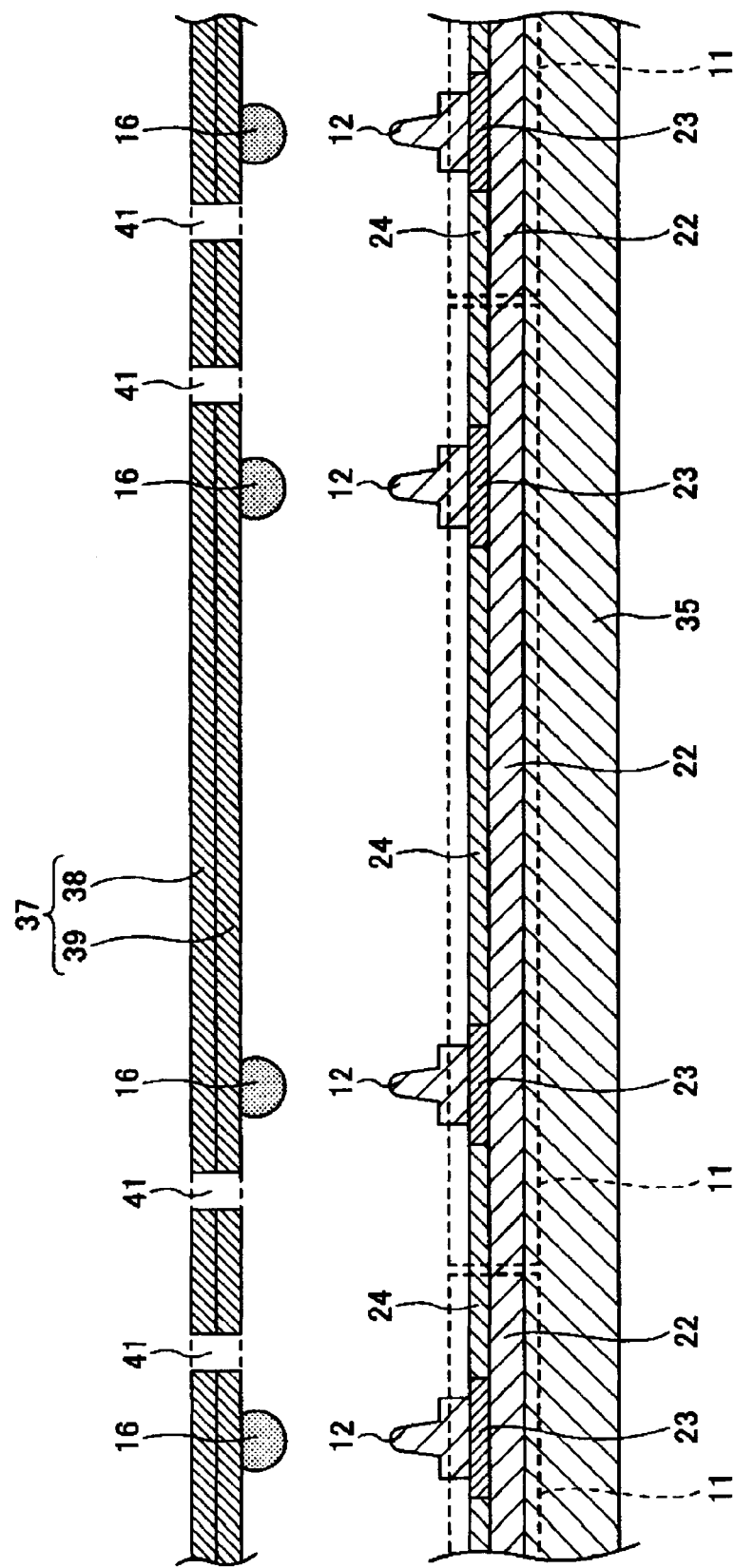
FIG. 17 is a view (No. 5) showing the step of manufacturing the semiconductor device according to the first embodiment of the invention.

At a step shown in FIG. 17, thereafter, the penetrating portion 41 formed on the support plate 37 having a metal layer is used as the alignment mark to dispose the semiconductor chips 11 formed on the semiconductor substrate 35 and the support plate 37 having a metal layer opposite to each other in such a manner that the internal connecting terminal 12 provided in the structure shown in FIG. 13 is opposed to the conductive terminal 16 provided in the structure shown in FIG. 16.

Figure 18:
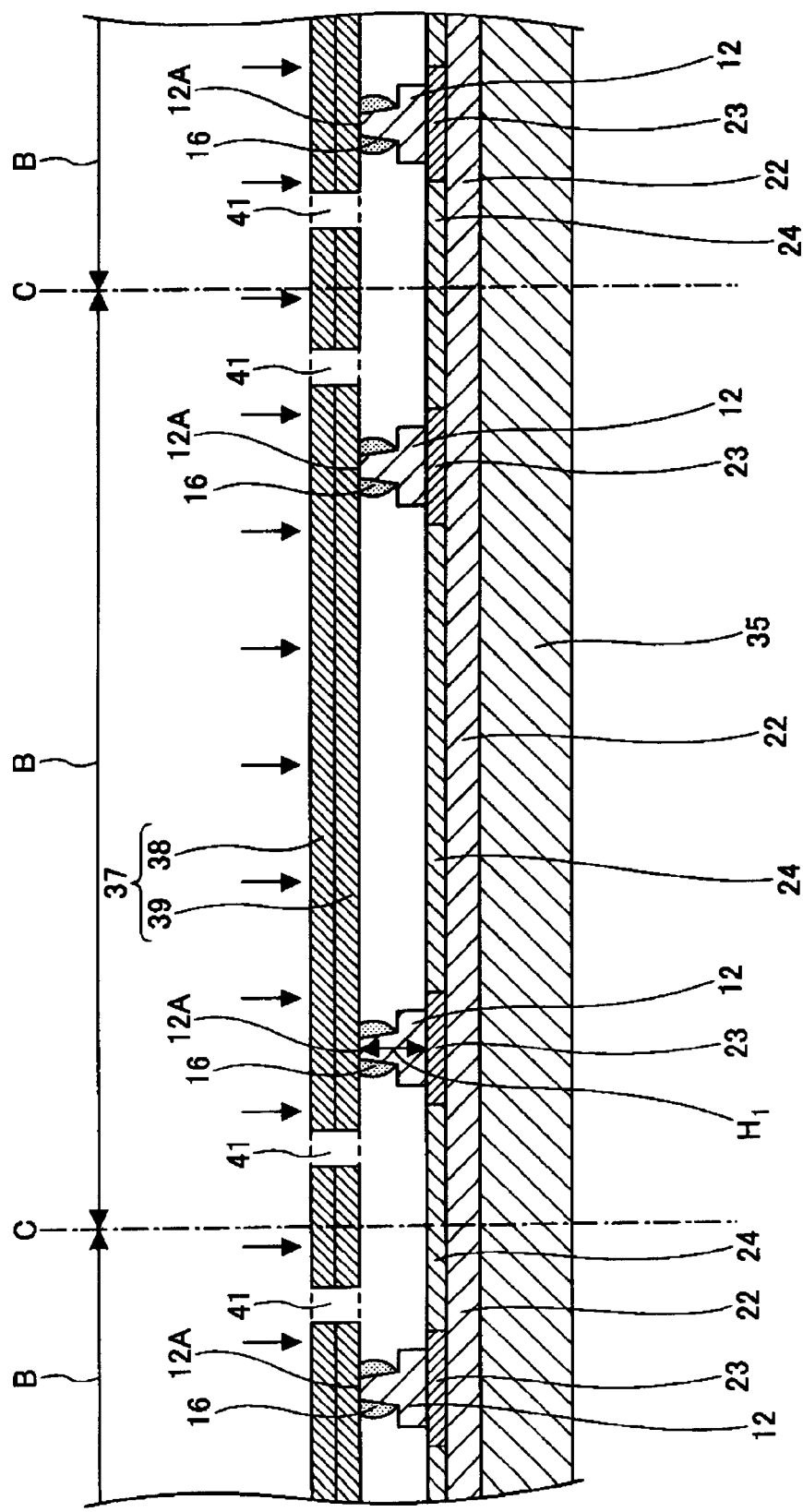
FIG. 18 is a view (No. 6) showing the step of manufacturing the semiconductor device according to the first embodiment of the invention.

At a step shown in FIG. 18, subsequently, in a state in which the internal connecting terminal 12 and the conductive terminal 16 are heated (a heating temperature is 180°, for example, in the case in which the Au bump is used for the conductive terminal 16), the support plate 37 having a metal layer is pressed in such a manner that the upper end of the internal connecting terminal 12 comes in contact with the metal layer 39 to pressure bond the internal connecting terminal 12 to the metal layer 39 (steps shown in FIGS. 17 and 18 indicate the pressure bonding step). At this time, the upper ends of the internal connecting terminals 12 and the metal layer 39 come in contact with each other so that the heights of the internal connecting terminals can be set to be equal to each other and the surfaces 12A of the upper ends of the internal connecting terminals 12 are almost flat. The internal connecting terminal 12 obtained after the pressure bonding step can be set to have a height $H_1$ of 30 µm to 50 µm, for example. Moreover, a clearance between the protective film 24 and the metal layer 39 can be set to be 30 µm to 50 µm, for example.

By using the penetrating portion 41 formed on the support plate 37 having a metal layer as the alignment mark when disposing the semiconductor chips 11 formed on the semiconductor substrate 35 and the support plate 37 having a metal layer opposite to each other, thus, it is possible to align the conductive terminal 16 with the internal connecting terminal 12 with high precision. Therefore, it is possible to enhance an electrical connecting reliability of the internal connecting terminal 12 and the metal layer 39 (the wiring pattern 14) in the portion in which the conductive terminal 16 is provided.

By pressing the support plate 37 having a metal layer to pressure bond the internal connecting terminal 12 to the metal layer 39 in a state in which the internal connecting terminal 12 and the conductive terminal 16 are heated, moreover, it is possible to simultaneously carry out a step of causing the heights of the internal connecting terminals 12 to be equal to each other and a step of connecting the internal connecting terminal 12 to the wiring pattern 14 which are conventionally executed separately. Therefore, it is possible to reduce the manufacturing cost of the semiconductor device 10.

At a step shown in FIG. 19, subsequently, a portion between the semiconductor chips 11 formed on the semiconductor substrate 35 and the support plate 37 having a metal layer and the penetrating portion 41 are sealed with a resin 46 (a sealing step). The resin 46 is a base material of the resin member 13 shown in FIG. 11 described above. For the resin 46, it is possible to use an underfill resin or a mold resin (for example, an epoxy resin), for example.

In the case in which the mold resin is used as the resin 46, the resin 46 can be formed by a transfer mold method. In this case, as shown in FIG. 19, the structure shown in FIG. 18 is accommodated between a lower metal mold 43 and an upper metal mold 44, and the resin 46 is then pressed into a portion between the lower metal mold 43 and the upper metal mold 44. Consequently, the portion between the semiconductor chips 11 and the support plate 37 having a metal layer and the penetrating portion 41 are sealed with the resin 46.

In the case in which the resin 46 is formed by using the transfer mold method, moreover, it is preferable to form a clearance between the upper metal mold 44 and the support 38 in such a manner that the upper metal mold 44 and the support 38 do not come in contact with each other. Thus, a clearance is formed between the upper metal mold 44 and the support 38 so that the support plate 37 having a metal layer is not pressed by the upper metal mold 44. Therefore, it is possible to prevent the metal layer 39 to be the base material of the wiring pattern 14 from being flexed. In this case, the resin 46 is formed to cover an upper surface of the support 38. At a step shown in FIG. 19, the case in which the resin 46 to be the base material of the resin member 13 is formed by the transfer mold method is taken as an example and is illustrated.

Figure 19:
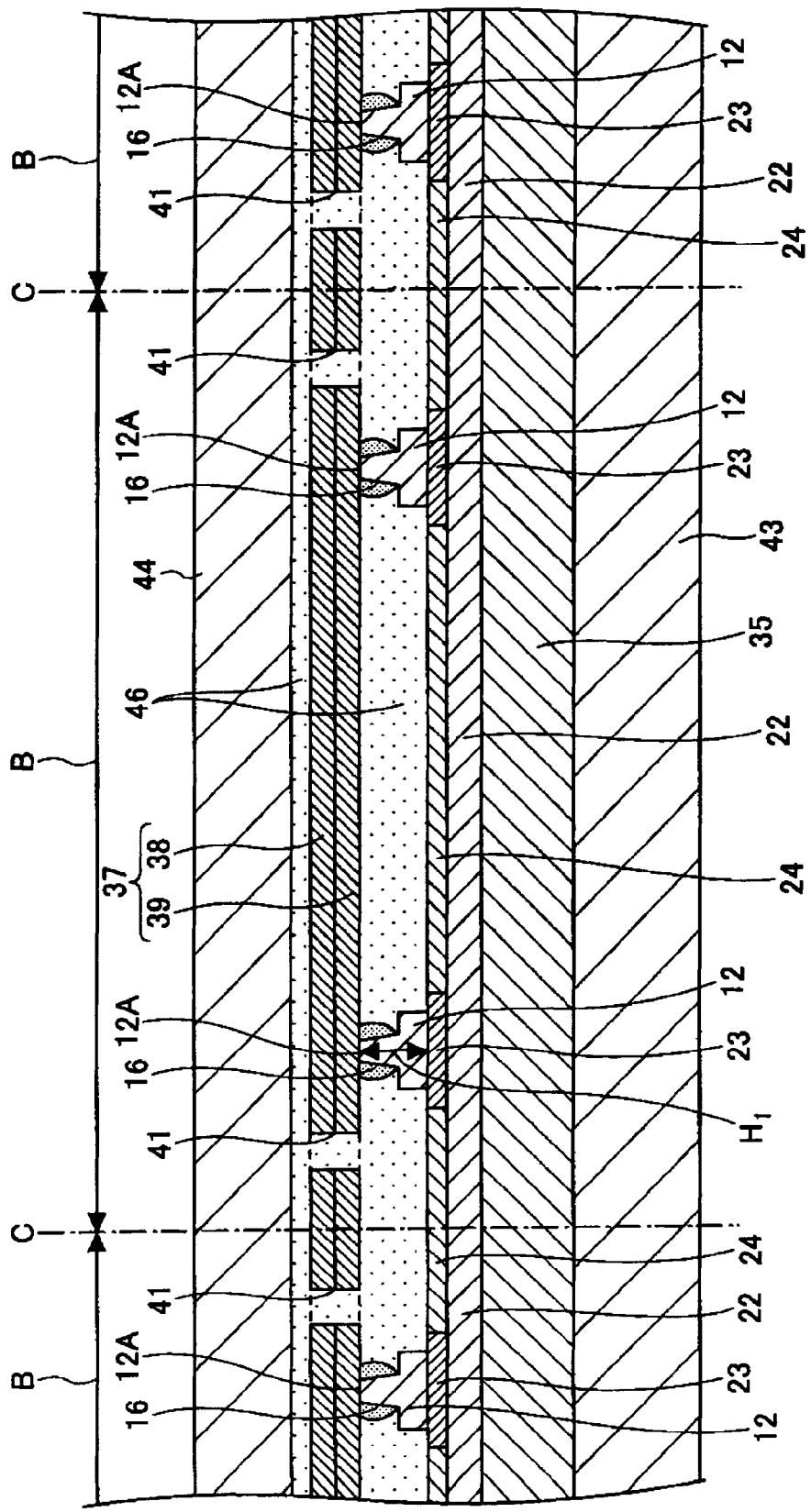
FIG. 19 is a view (No. 7) showing the step of manufacturing the semiconductor device according to the first embodiment of the invention.
Figure 20:
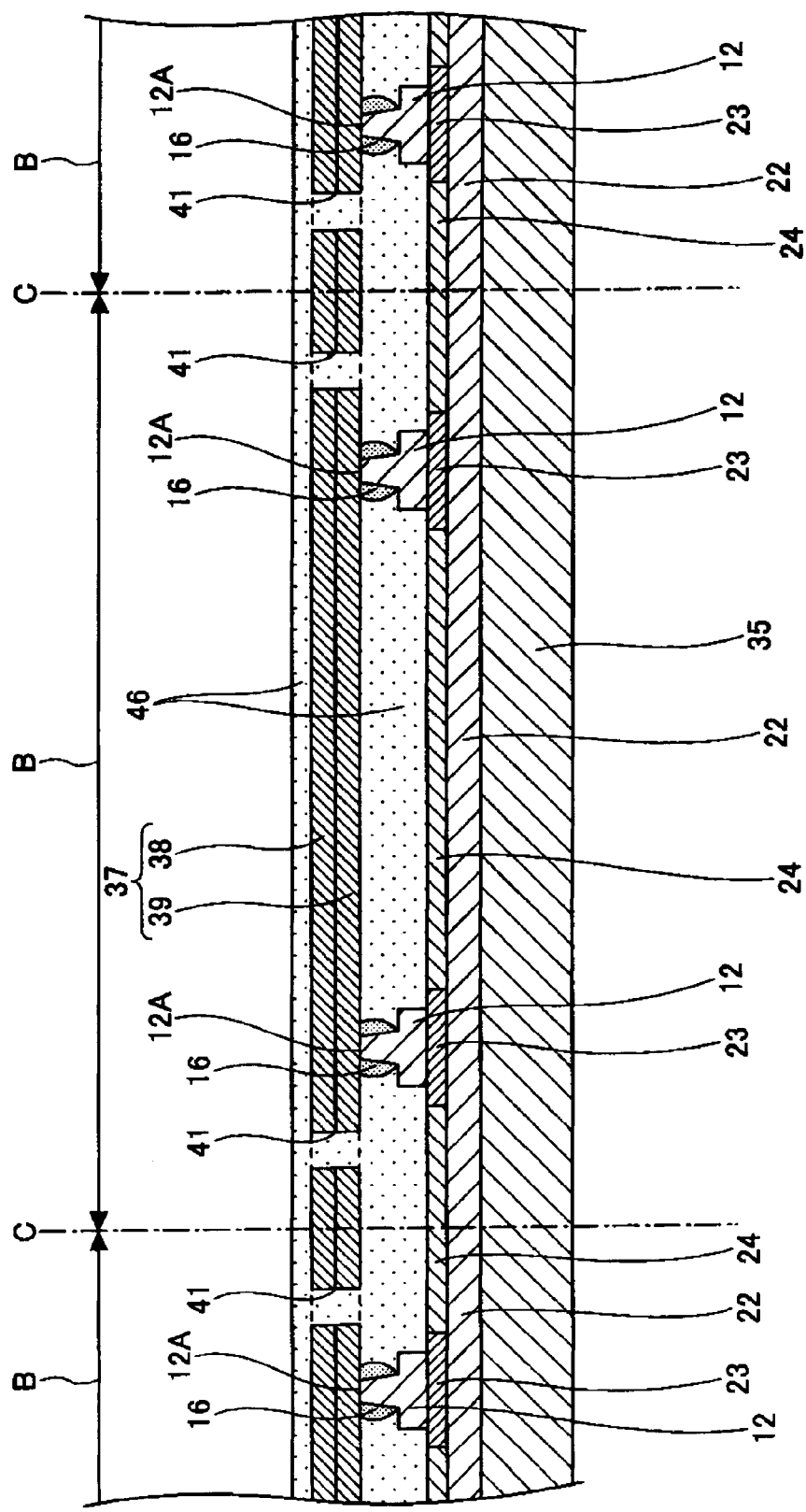
FIG. 20 is a view (No. 8) showing the step of manufacturing the semiconductor device according to the first embodiment of the invention.

At a step shown in FIG. 20, subsequently, the lower metal mold 43 and the upper metal mold 44 shown in FIG. 19 are removed from the structure shown in FIG. 18 in which the resin 46 is formed.

Figure 21:
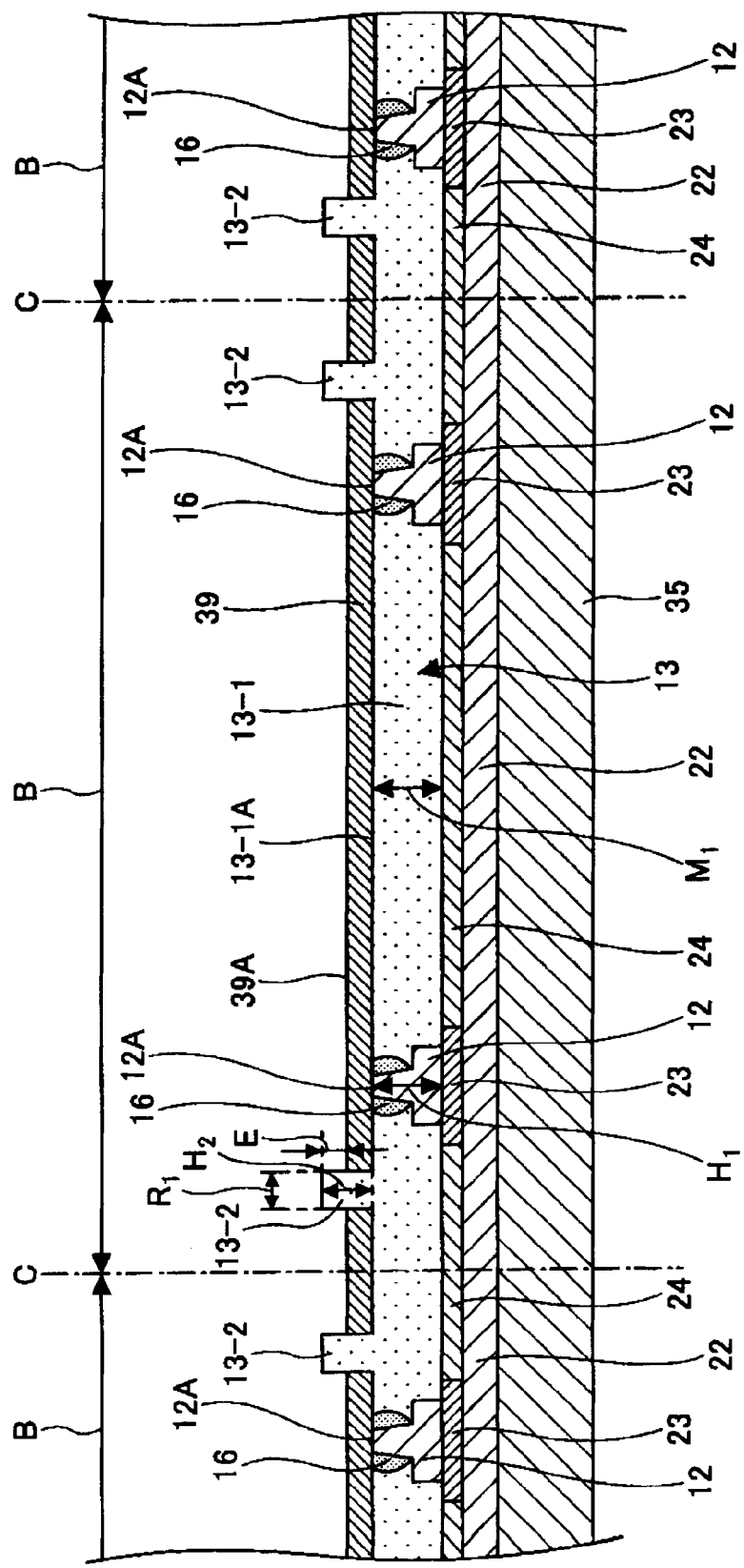
FIG. 21 is a view (No. 9) showing the step of manufacturing the semiconductor device according to the first embodiment of the invention.

At a step shown in FIG. 21, subsequently, the support 38 is peeled from the metal layer 39 provided in the structure shown in FIG. 20, and the resin 46 formed on the support 38 is removed together with the support 38 so that the protruded portion 13-2 is formed (a protruded portion forming step). Consequently, the resin member 13 including the resin member body 13-1 and the protruded portion 13-2 is formed.

A thickness $M_1$ of the resin member body 13-1 (a thickness of the resin member body 13-1 in a portion disposed between the protective film 24 and the metal layer 39) can be set to be 30 μm to 50 μm, for example. The protruded portions 13-2 are formed one by one in the vicinity of four corner portions of the resin member body 13-1. In the case in which the protruded portion 13-2 takes a cylindrical shape, a diameter $R_1$ of the protruded portion 13-2 can be set to be 100 μm, for example. A height $H_2$ of the protruded portion 13-2 can be set to be 50 μm, for example. Moreover, a protrusion amount E of the protruded portion 13-2 based on an upper surface 39A of the metal layer 39 can be set to be 38 μm, for example.

At a step shown in FIG. 22, subsequently, the protruded portion 13-2 is used as the alignment mark to form a resist film 48 covering the metal layer 39 in a corresponding part to the region in which the wiring pattern 14 is formed (a resist film forming step). The resist film 48 serves as a mask for etching the metal layer 39. More specifically, in the case in which the resist film 48 is a positive resist, the resist is applied onto the metal layer 39 and an inexpensive exposing device (not shown) including a CCD camera (not shown) is then used to detect the position of the protruded portion 13-2 to be the alignment mark, and a light is irradiated on the resist in the corresponding part to the region in which the wiring pattern 14 is formed to carry out an exposing treatment, and the resist obtained after the exposure is thereafter subjected to a developing treatment so that the resist film 48 is formed.

By using the protruded portion 13-2 as the alignment mark when carrying out the exposing treatment over the resist film 48 for patterning the metal layer 39 to be the base material of the wiring pattern 14, thus, it is possible to enhance the precision in the position in which the resist film 48 is formed more greatly than that in the conventional art. Therefore, it is possible to enhance the precision in the position in which the wiring pattern 14 is formed with respect to the internal connecting terminal 12.

When forming a resist film (not shown) serving as a mask for patterning the metal layer 39 to be the base material of the wiring pattern 14, moreover, it is possible to detect the position of the protruded portion 13-2 serving as the alignment mark by using an inexpensive exposing device (not shown) including a CCD camera (not shown). Therefore, it is possible to reduce the manufacturing cost of the semiconductor device 10.

Figure 22:
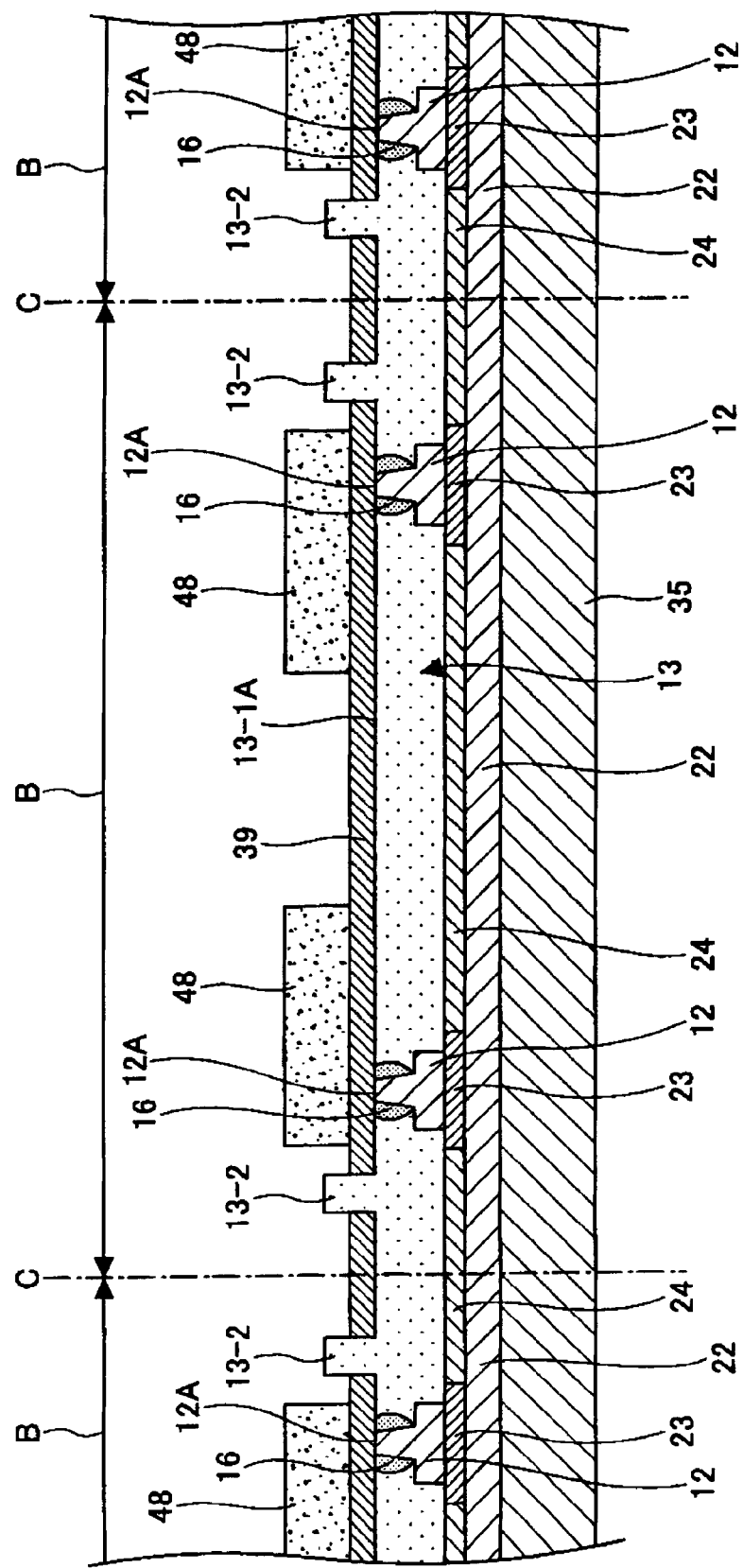
FIG. 22 is a view (No. 10) showing the step of manufacturing the semiconductor device according to the first embodiment of the invention.
Figure 23:
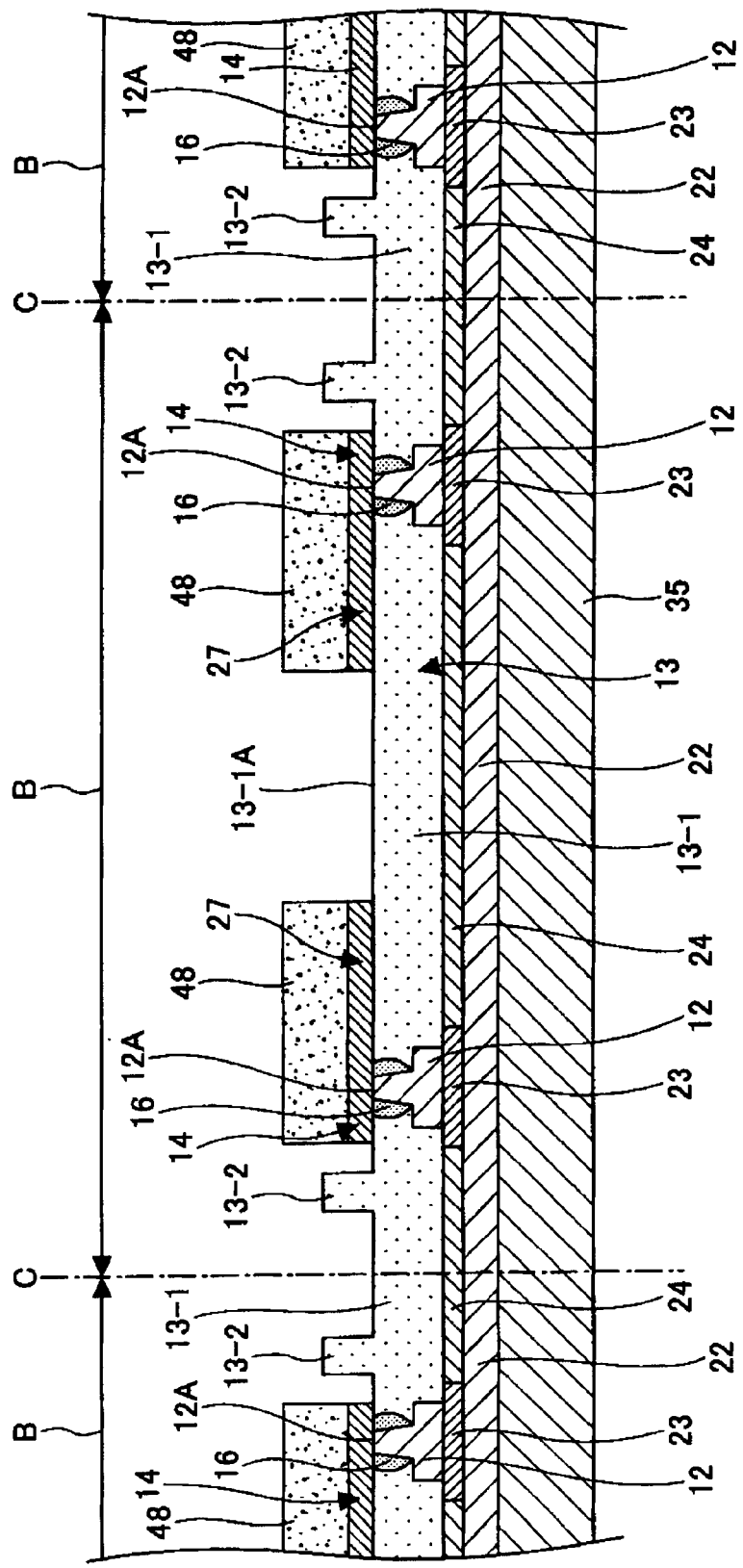
FIG. 23 is a view (No. 11) showing the step of manufacturing the semiconductor device according to the first embodiment of the invention.
Figure 24:
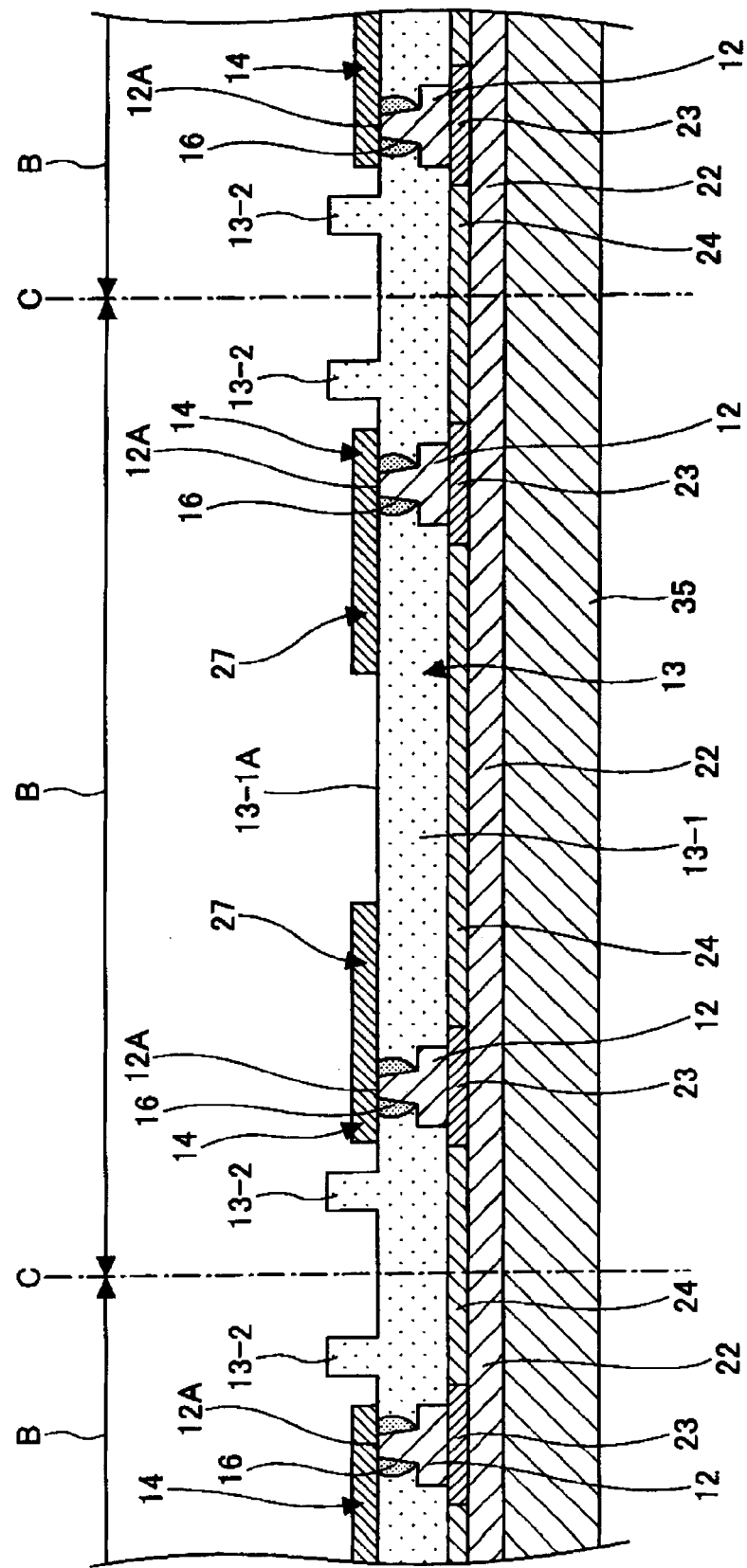
FIG. 24 is a view (No. 12) showing the step of manufacturing the semiconductor device according to the first embodiment of the invention.

At a step shown in FIG. 23, next, the metal layer 39 shown in FIG. 22 is subjected to etching (more specifically, for example, anisotropic etching) by using the resist film 48 as a mask to form the wiring pattern 14 connected to the internal connecting terminal 12 (a wiring pattern forming step). In FIGS. 21 to 23, the case in which the wiring pattern 14 is formed by a subtractive method is taken as an example and is illustrated.

The wiring pattern 14 has the pad portion 27 in which the external connecting terminal 18 is provided. A thickness of the wiring pattern 14 is almost equal to that of the metal layer 39. The thickness of the wiring pattern 14 can be set to be 12 μm, for example. At a step shown in FIG. 24, subsequently, the resist film 48 shown in FIG. 23 is removed.

Figure 25:
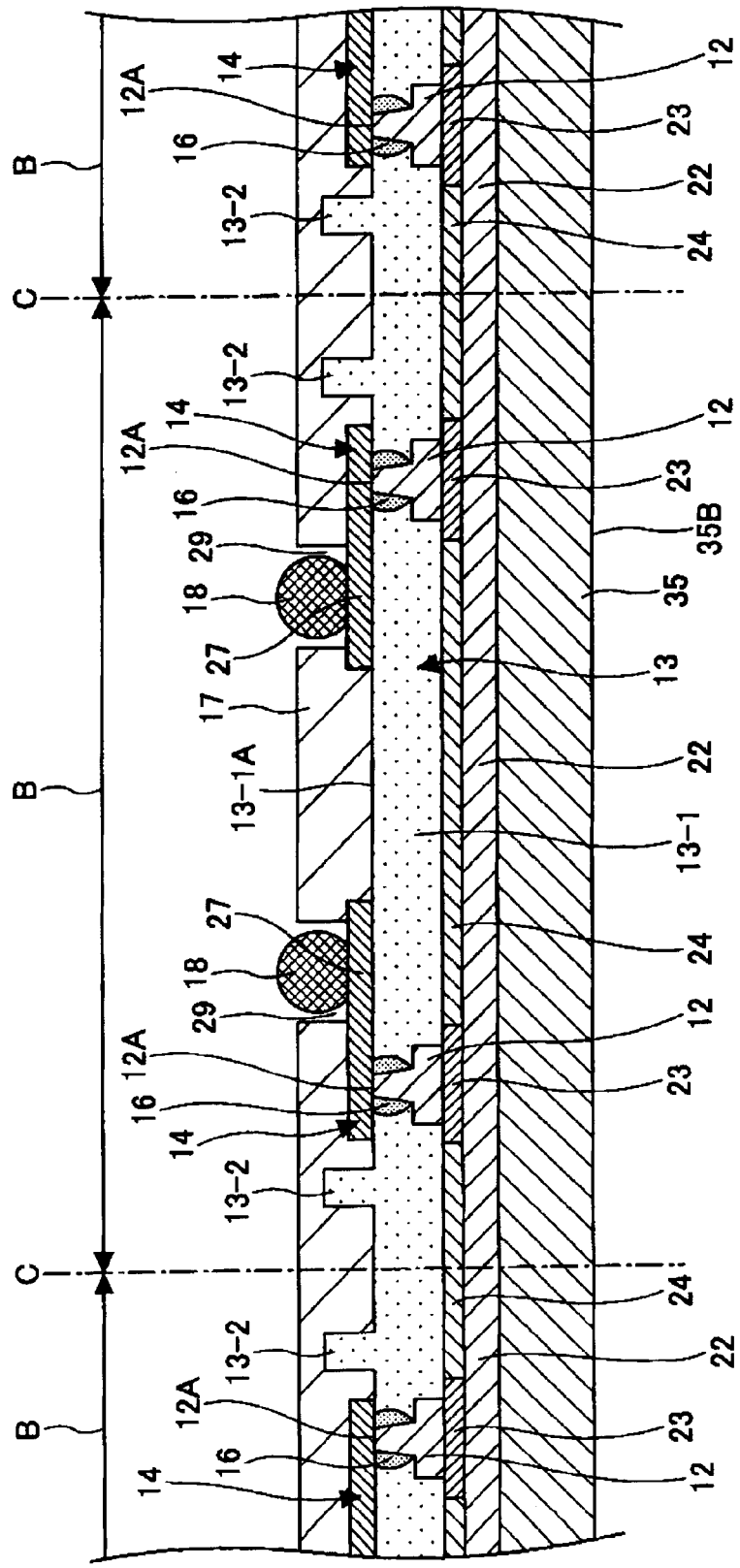
FIG. 25 is a view (No. 13) showing the step of manufacturing the semiconductor device according to the first embodiment of the invention.

At a step shown in FIG. 25, next, the wiring pattern 14 in a portion excluding the pad portion 27 and the solder resist 17 covering the protruded portion 13-2 are formed on the upper surface 13-1A of the resin member body 13-1 by a well-known technique, and the external connecting terminal 18 is then formed on the pad portion 27. The solder resist 17 has the opening portion 29 for exposing the pad portion 27. For example, it is possible to use a solder bump as the external connecting terminal 18.

At a step shown in FIG. 26, subsequently, the thickness of the semiconductor substrate 35 is reduced from a back face 35B side of the semiconductor substrate 35 shown in FIG. 25. More specifically, the semiconductor substrate 35 is polished or ground from the back face 35B side of the semiconductor substrate 35, thereby changing the semiconductor substrate 35 into a thin plate. Consequently, a structure corresponding to the semiconductor device 10 is formed in the semiconductor device forming region B of the semiconductor substrate 35. In order to reduce the thickness of the semiconductor substrate 35, for example, it is possible to use a backside grinder. The thickness of the semiconductor substrate 35 obtained after reducing the thickness can be set to be 100 μm to 300 μm, for example.

Figure 26:
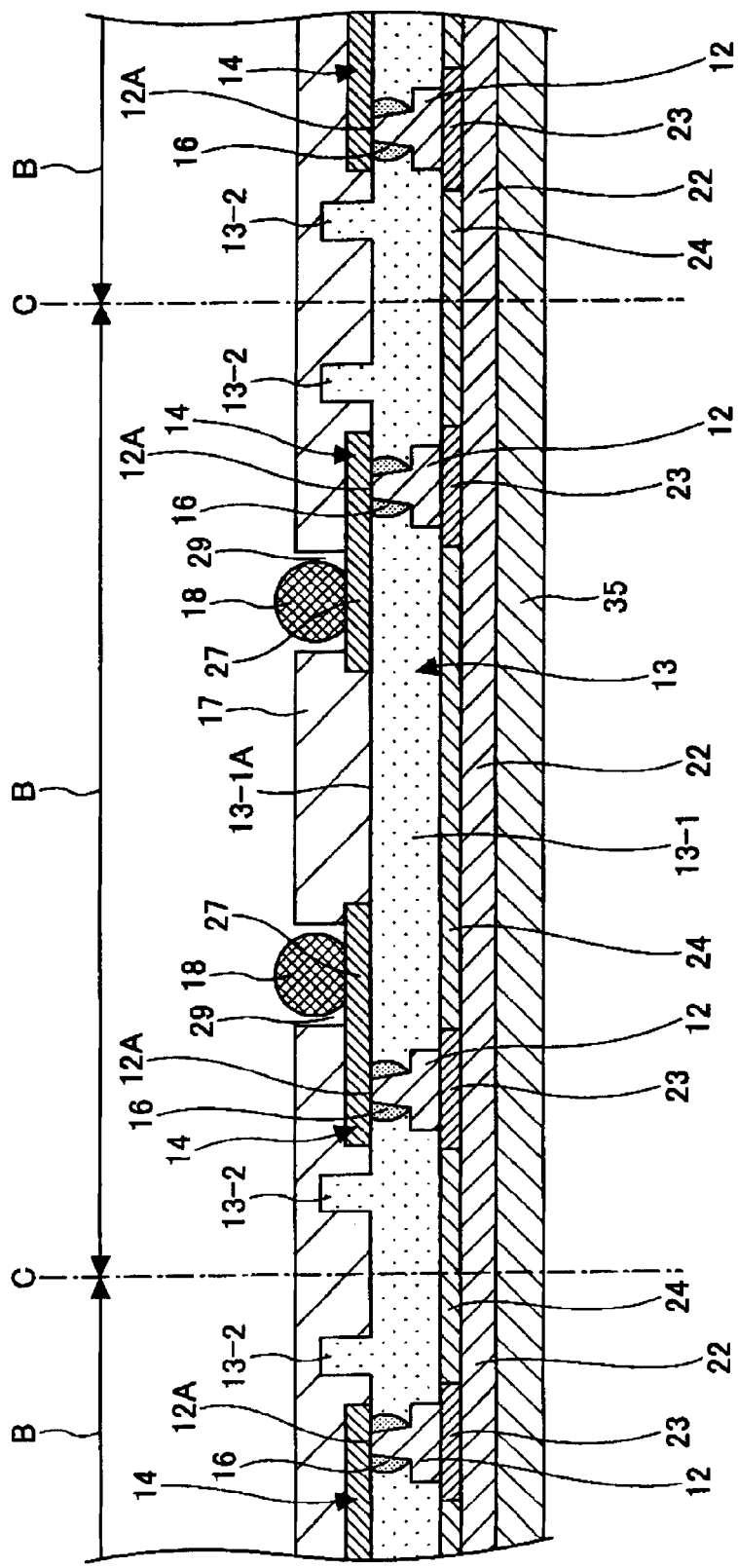
FIG. 26 is a view (No. 14) showing the step of manufacturing the semiconductor device according to the first embodiment of the invention.
Figure 27:
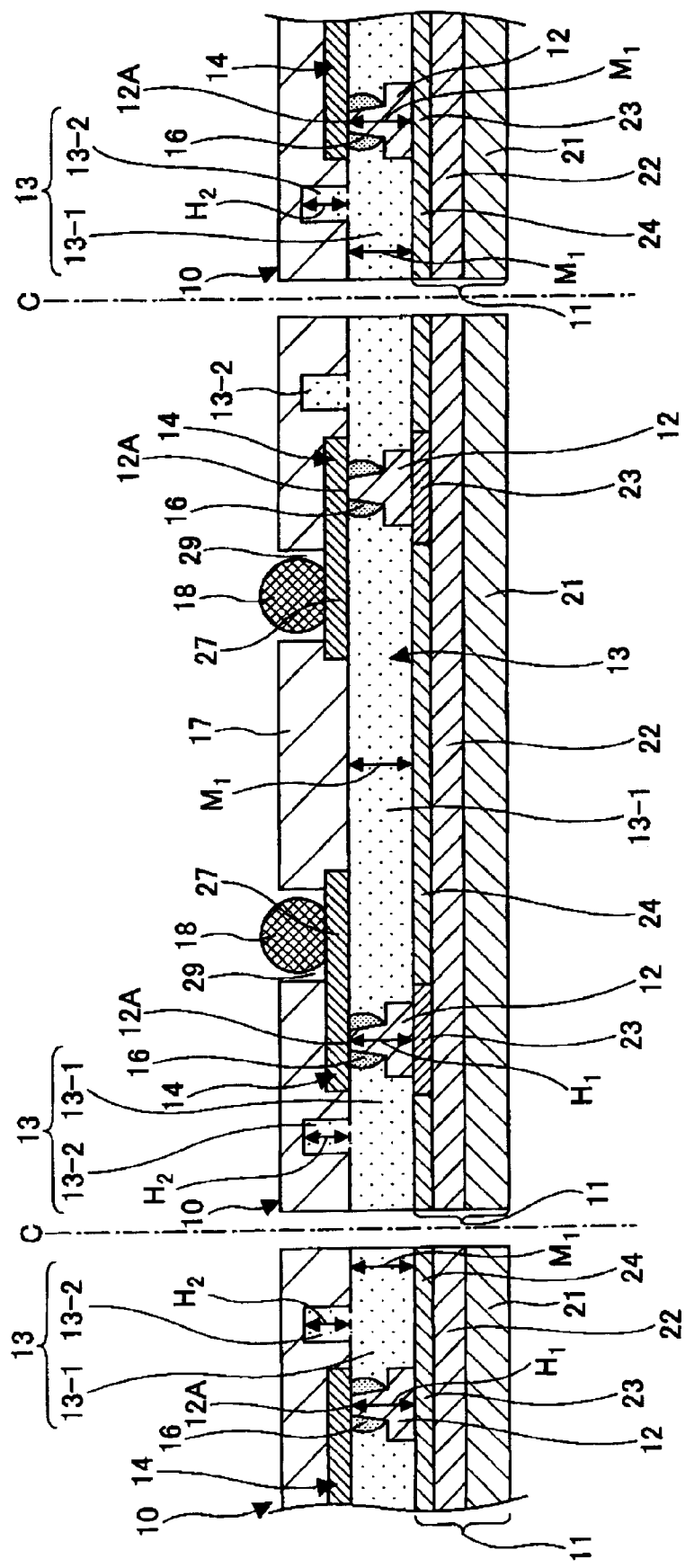
FIG. 27 is a view (No. 15) showing the step of manufacturing the semiconductor device according to the first embodiment of the invention.
Figure 28:
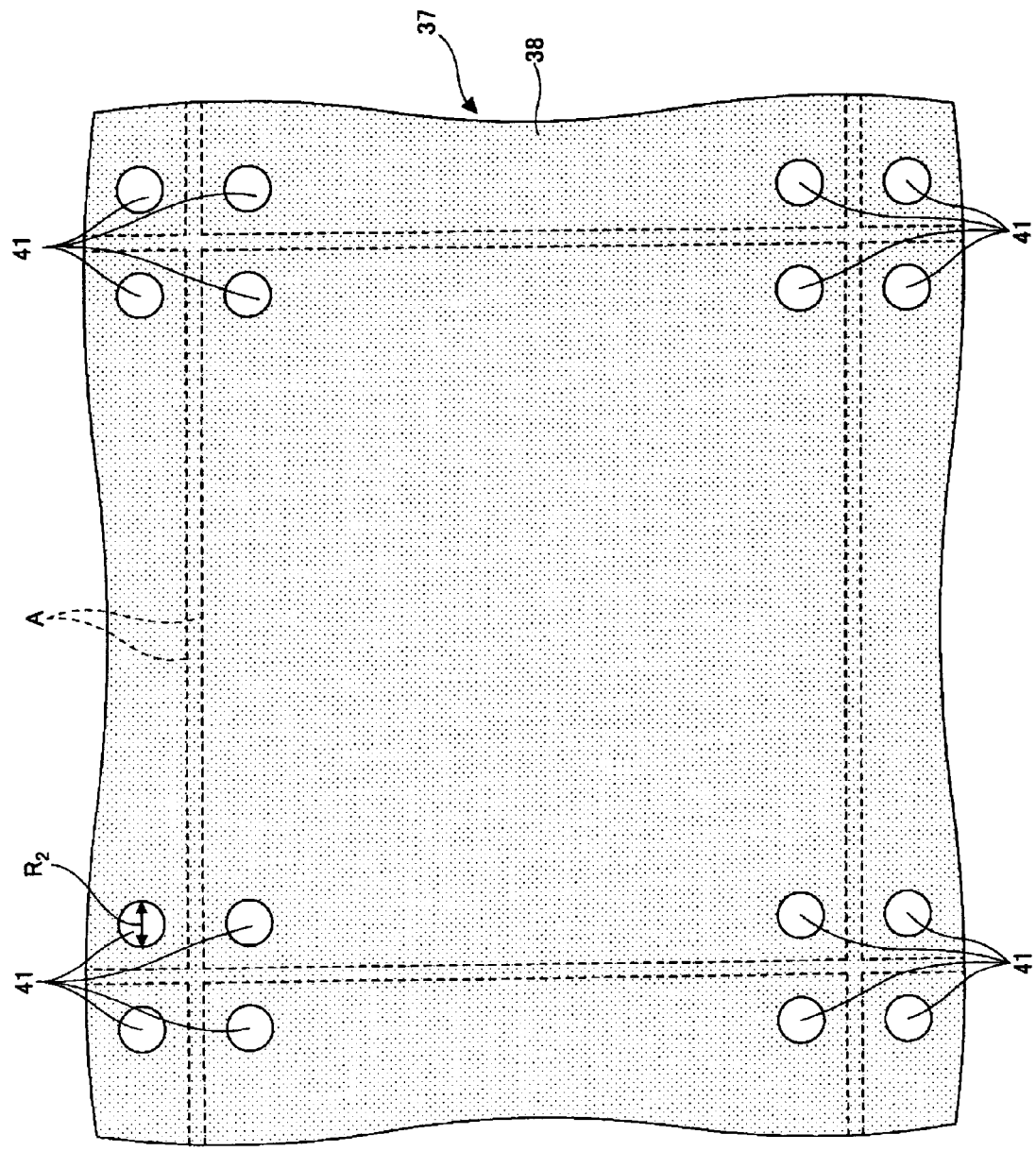
FIG. 28 is a plan view for explaining a penetrating portion formed on a support plate having a metal layer.

At a step shown in FIG. 27, next, a portion corresponding to the cutting position C of the structure shown in FIG. 26 is cut. Consequently, the structure is divided into individual pieces so that the semiconductor devices 10 are manufactured.

According to the method of manufacturing a semiconductor device in accordance with the embodiment, by pressing the support plate 37 having a metal layer to pressure bond the internal connecting terminal 12 to the metal layer 39 in a state in which the internal connecting terminal 12 and the conductive terminal 16 are heated, it is possible to simultaneously carry out a step of causing the heights of the internal connecting terminals 12 to be equal to each other and a step of connecting the internal connecting terminal 12 to the wiring pattern 14 which are conventionally executed separately. Therefore, it is possible to reduce the manufacturing cost of the semiconductor device 10.

By using the protruded portion 13-2 as the alignment mark when carrying out the exposing treatment over the resist film 48 serving as the mask for patterning the metal layer 39 to be the base material of the wiring pattern 14, moreover, it is possible to enhance the precision in the position in which the resist film 48 is formed more greatly than that in the conventional art. Therefore, it is possible to enhance the precision in the position in which the wiring pattern 14 is formed with respect to the internal connecting terminal 12.

When forming the resist film 48 serving as a mask for patterning the metal layer 39 to be the base material of the wiring pattern 14, furthermore, it is possible to detect the position of the protruded portion 13-2 serving as the alignment mark by using an inexpensive exposing device (not shown) including a CCD camera (not shown). Therefore, it is possible to reduce the manufacturing cost of the semiconductor device 10.

Second Embodiment

Figure 29:
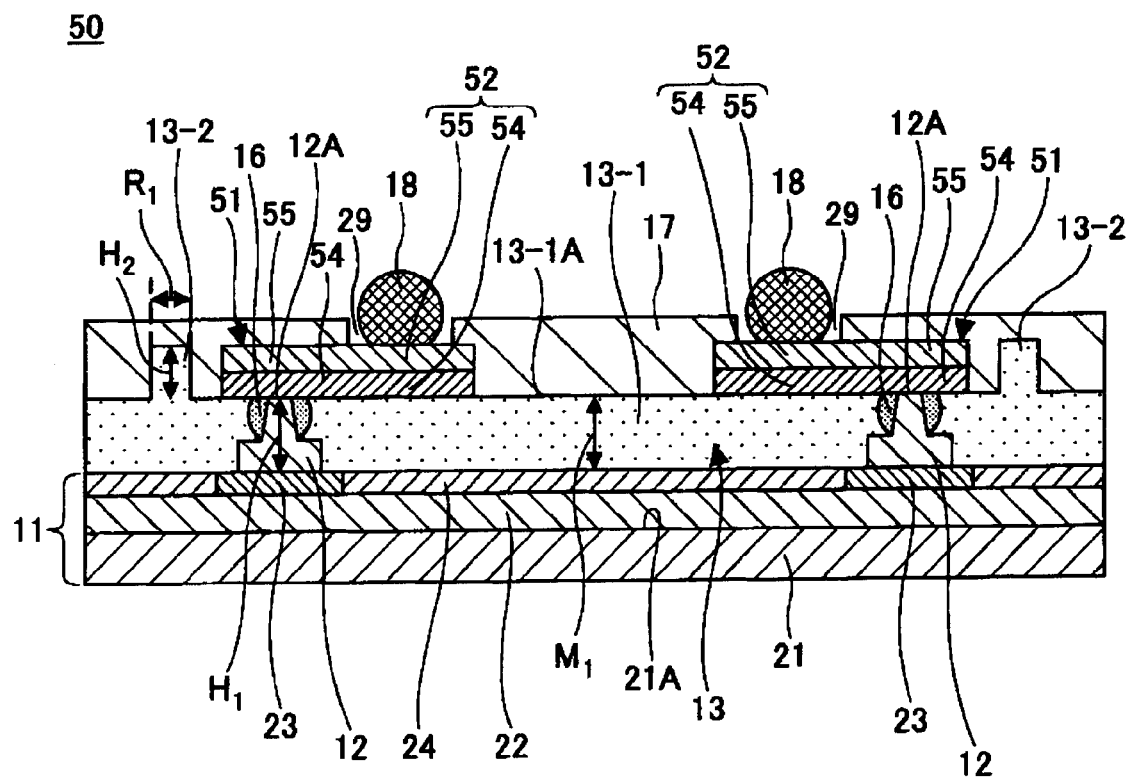
FIG. 29 is a sectional view showing a semiconductor device according to a second embodiment of the invention.

FIG. 29 is a sectional view showing a semiconductor device according to a second embodiment of the invention. In FIG. 29, the same components as those in the semiconductor device 10 according to the first embodiment have the same reference numerals.

Referring to FIG. 29, a semiconductor device 50 according to the second embodiment has the same structure as that of the semiconductor device 10 except that a wiring pattern 51 is provided in place of the wiring pattern 14 disposed in the semiconductor device 10 according to the first embodiment (a wiring pattern formed by using a subtractive method).

The wiring pattern 51 has such a structure that a metal layer 54 and a plated film 55 are laminated. The wiring pattern 51 has a pad portion 52 on which an external connecting terminal 18 is provided. The metal layer 54 is provided on an upper surface 12A of an upper end of an internal connecting terminal 12 and an upper surface 13-1A of a resin member body 13-1. A lower surface of the metal layer 54 is provided in contact with the upper surface 12A of the upper end of the internal connecting terminal 12. The lower surface of the metal layer 54 is provided with a conductive terminal 16 for connecting the internal connecting terminal 12 to the metal layer 54. The metal layer 54 is a feeding layer for forming the plated film 55. For the metal layer 54, it is possible to use a Cu layer, for example. In the case in which the Cu layer is used as the metal layer 54, the metal layer 54 can be set to have a thickness of 2 μm to 3 μm, for example.

The plated film 55 is laminated on the metal layer 54. For the plated film 55, it is possible to use a Cu plated film, for example. In the case in which the Cu plated film is used for the plated film 55, the plated film 55 can be set to have a thickness of 10 μm, for example. The plated film 55 can be formed by an electrolytic method, for example. The wiring pattern 51 having the structure can be formed by a semiadditive method, for example.

The semiconductor device 50 according to the second embodiment having the structure can produce the same advantages as those of the semiconductor device 10 according to the first embodiment.

Figure 30:
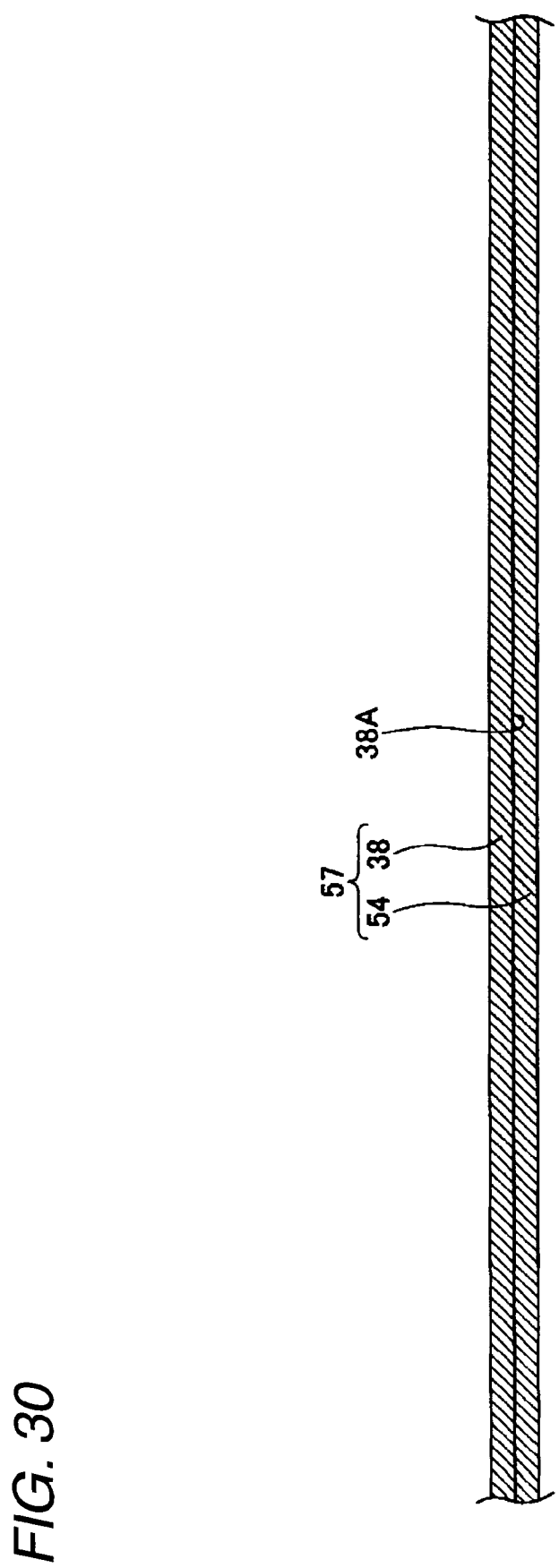
FIG. 30 is a view (No. 1) showing a step of manufacturing the semiconductor device according to the second embodiment of the invention.
Figure 35:
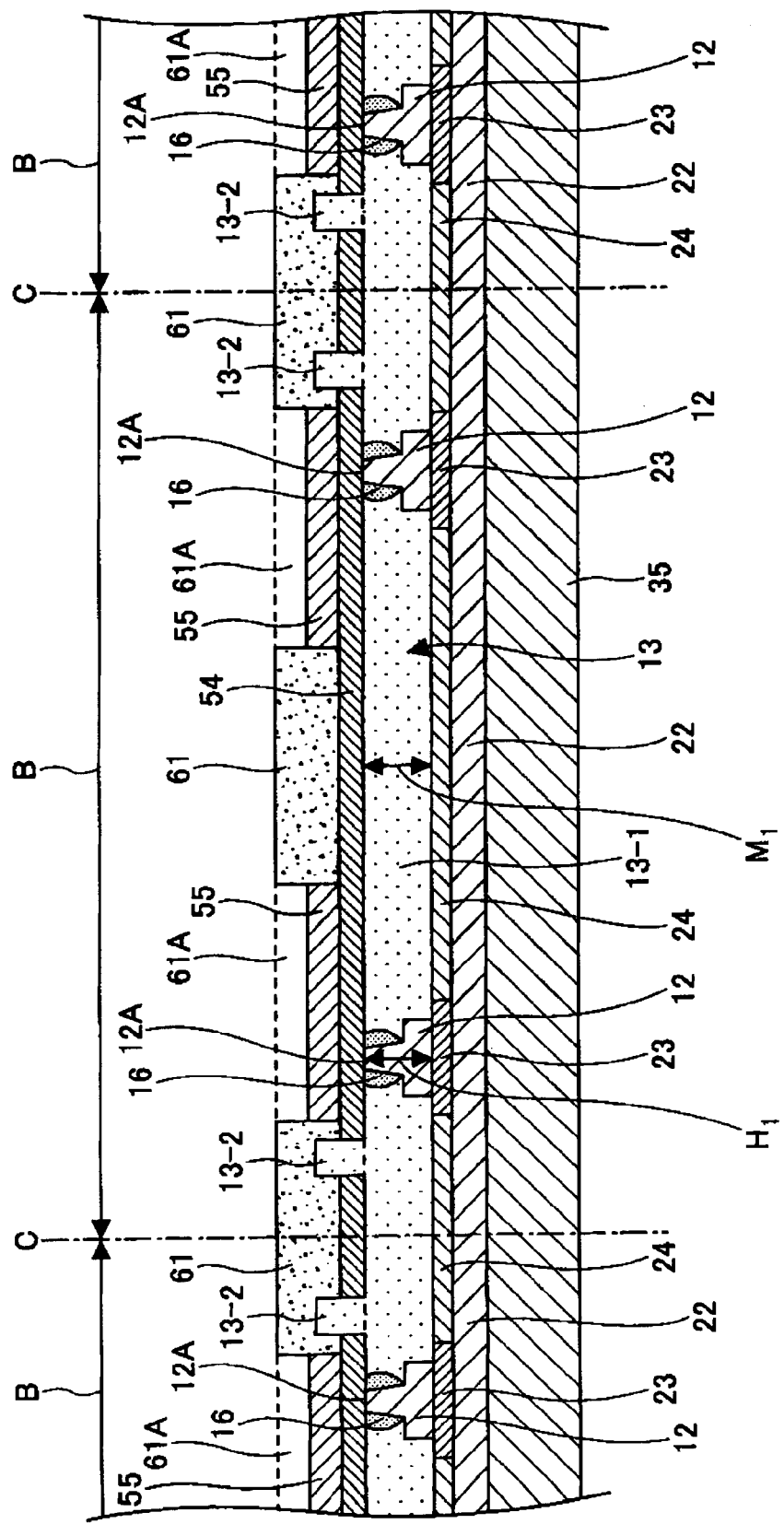
FIG. 35 is a view (No. 6) showing the step of manufacturing the semiconductor device according to the second embodiment of the invention.
Figure 36:
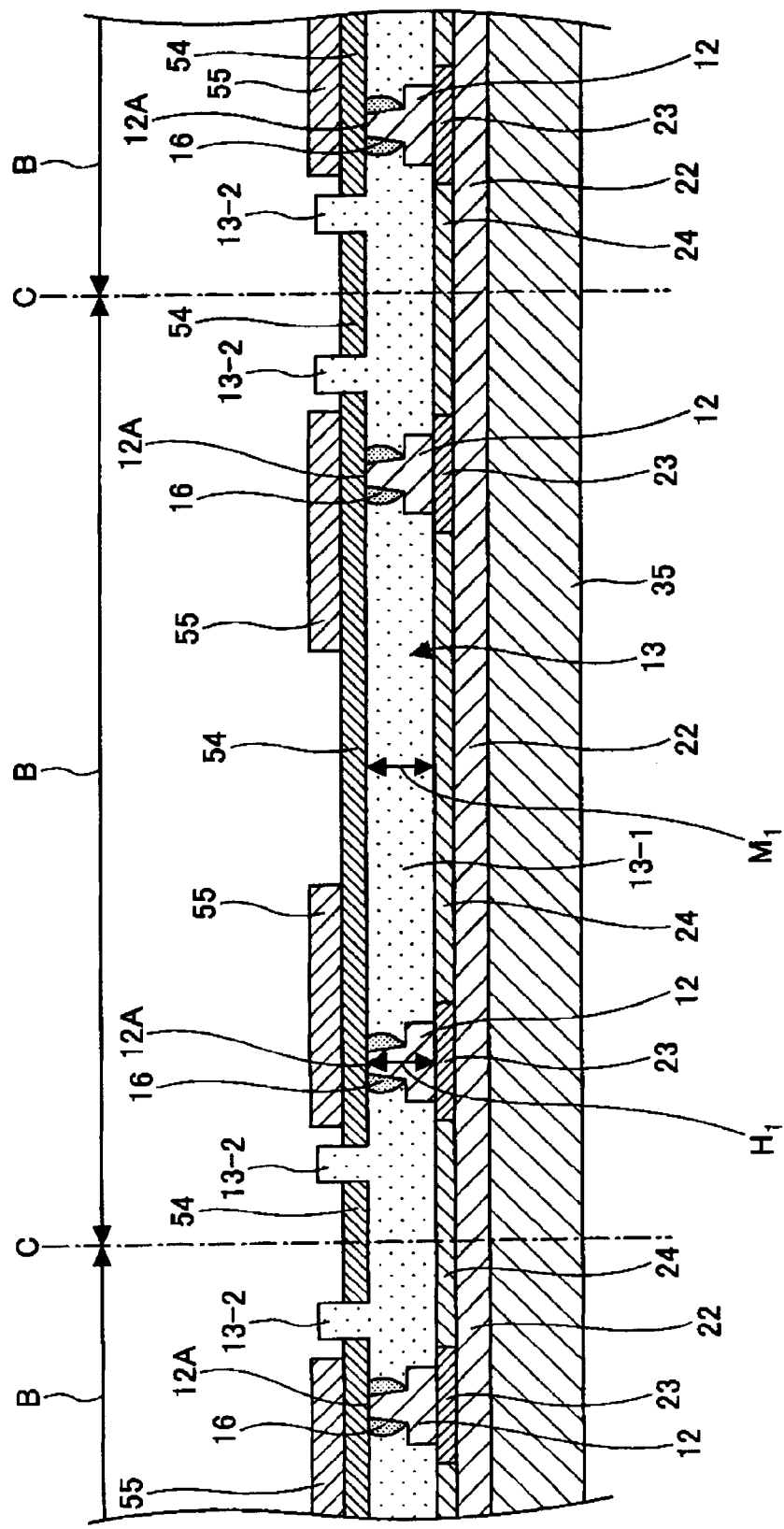
FIG. 36 is a view (No. 7) showing the step of manufacturing the semiconductor device according to the second embodiment of the invention.
Figure 37:
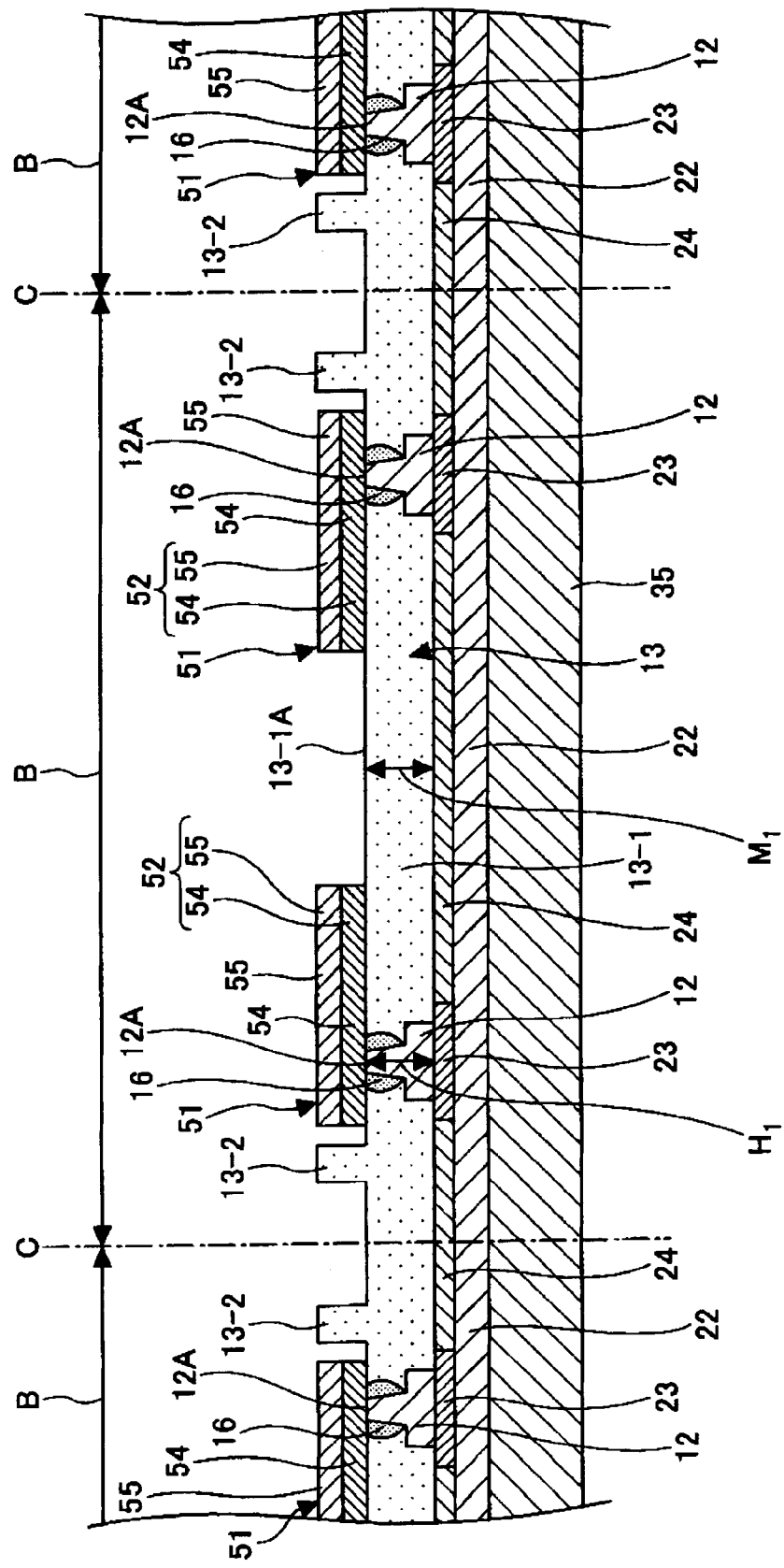
FIG. 37 is a view (No. 8) showing the step of manufacturing the semiconductor device according to the second embodiment of the invention.

FIGS. 30 to 37 are views showing a process for manufacturing the semiconductor device according to the second embodiment of the invention. In FIGS. 30 and 37, the same components as those in the semiconductor device 50 according to the second embodiment have the same reference numerals.

With reference to FIGS. 30 to 37, description will be given to a method of manufacturing the semiconductor device 50 according to the second embodiment. First of all, the same step as that shown in FIG. 13 described in the first embodiment is carried out to form a plurality of semiconductor chips 11 having a semiconductor integrated circuit 22, an electrode pad 23 and a protective film 24 on a semiconductor substrate 35 having a plurality of semiconductor chip forming regions and to then form an internal connecting terminal 12 on the electrode pad 23 (an internal connecting terminal forming step).

At a step shown in FIG. 30, subsequently, there is prepared the support plate 57 having a metal layer in which the metal layer 54 serving as a feeding layer for forming the plated film 55 (see FIG. 29) is stuck to a surface 38A of a support plate 38 (a step of preparing a support plate having a metal layer). The metal layer 54 is stuck to the support plate 38 in a state in which it can be peeled from the support plate 38. It is sufficient that the support plate 38 can support the metal layer 54. More specifically, it is possible to use a metal plate (for example, a Cu plate), a metal foil (for example, a Cu foil) and a resin plate for the support plate 38, for example. In the case in which the Cu foil is used as the support plate 38, the support plate 38 can be set to have a thickness of 35 μm, for example.

For the metal layer 54, a Cu layer can be used, for example. In the case in which the Cu layer is used as the metal layer 54, the metal layer 54 can be set to have a thickness of 2 μm to 3 μm, for example.

Figure 31:
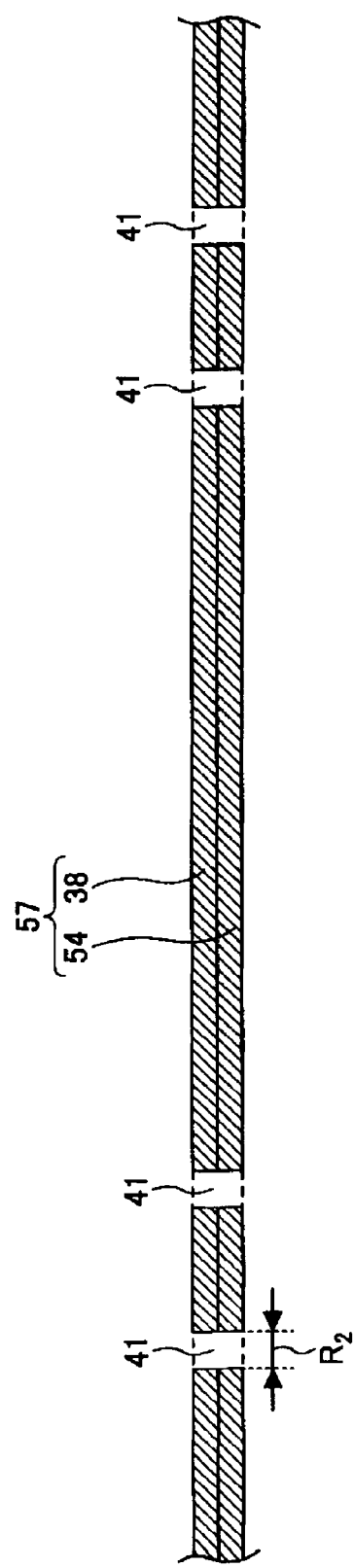
FIG. 31 is a view (No. 2) showing the step of manufacturing the semiconductor device according to the second embodiment of the invention.

At a step shown in FIG. 31, next, a penetrating portion 41 is formed on the support plate 57 having a metal layer in the opposed part to the semiconductor chip 11 shown in FIG. 13 described in the first embodiment (a penetrating portion forming step). The penetrating portions 41 are formed one by one on the support plates 57 having metal layers in opposed parts to four corner portions of an external position A of the semiconductor chip 11 taking a square shape seen on a plane, for example. The penetrating portion 41 can be formed by using a method such as a router processing, drilling or pressing. For the shape of the penetrating portion 41, moreover, it is possible to use a shape of a cylinder, a square pole or a slit (a trench). In the case in which the penetrating portion 41 takes the cylindrical shape, a diameter $R_2$ of the penetrating portion 41 can be set to be 100 μm, for example.

Figure 32:
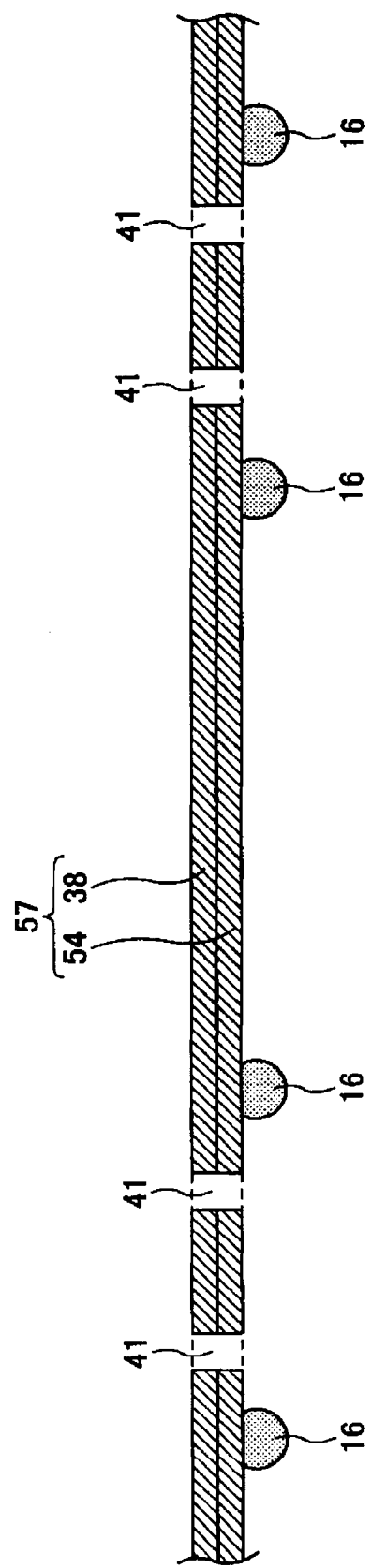
FIG. 32 is a view (No. 3) showing the step of manufacturing the semiconductor device according to the second embodiment of the invention.

At a step shown in FIG. 32, then, the conductive terminal 16 is formed on the metal layer 54 in the opposed part to the internal connecting terminal 12 provided in the structure shown in FIG. 13 described in the first embodiment (a conductive terminal forming step). For the conductive terminal 16, it is possible to use a conductive paste (more specifically, for example, an Ag paste or a Cu paste) or a bump (more specifically, for example, an Au bump or a Cu bump), for example.

Figure 33:
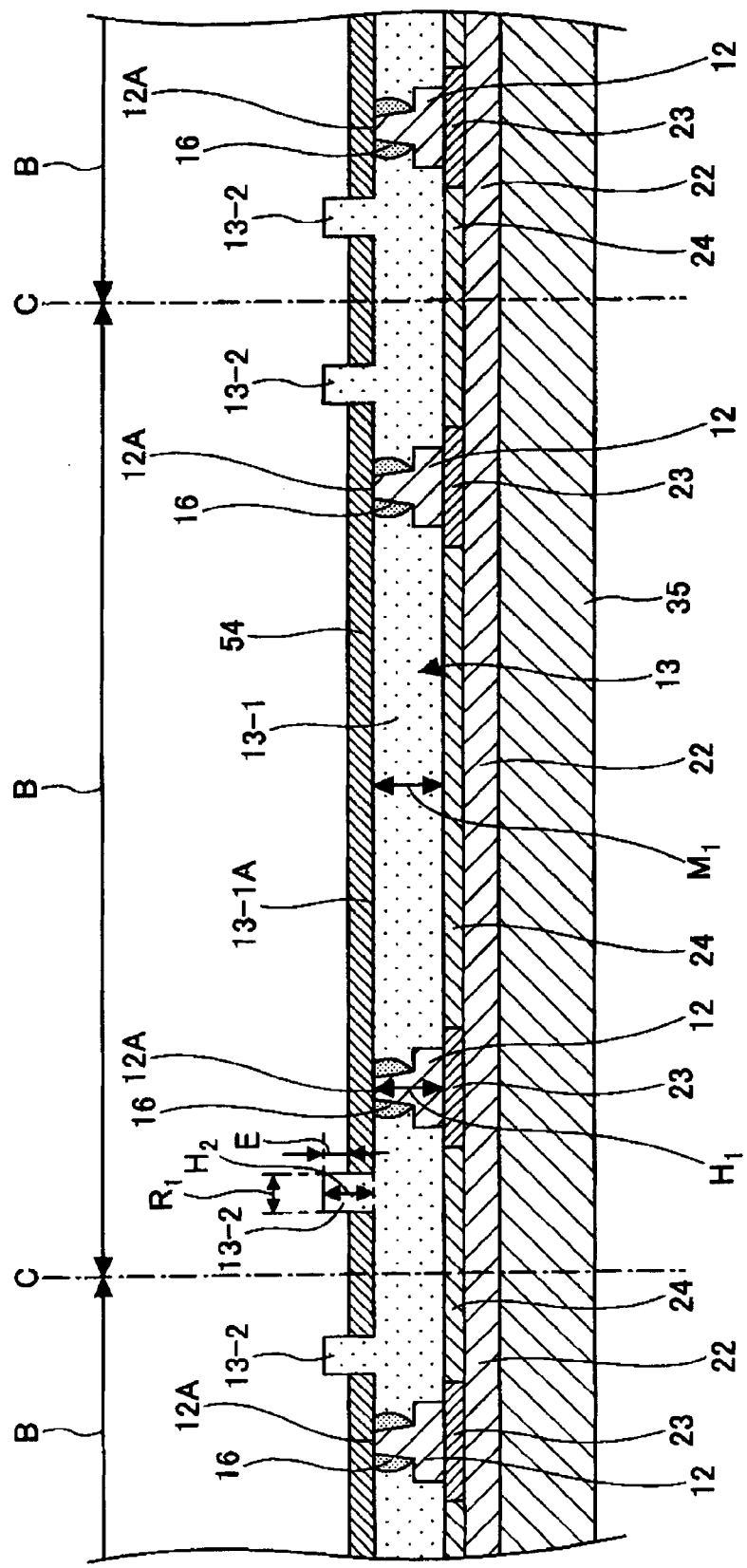
FIG. 33 is a view (No. 4) showing the step of manufacturing the semiconductor device according to the second embodiment of the invention.

At a step shown in FIG. 33, thereafter, the same processing as that in the steps shown in FIGS. 17 to 21 (including the pressure bonding step, the sealing step and the protruded portion forming step) described in the first embodiment is carried out to form the structure shown in FIG. 33. A height $H_1$ of the internal connecting terminal 12 which is obtained after the pressure bonding step can be set to be 30 μm to 50 μm, for example. Moreover, a clearance between the protective film 24 and the metal layer 54 can be set to be 30 μm to 50 μm, for example. A thickness $M_1$ of the resin member body 13-1 can be set to be 30 μm to 50 μm, for example. Protruded portions 13-2 are disposed one by one in the vicinity of the four corner portions of the resin member body 13-1. In the case in which the protruded portion 13-2 takes the cylindrical shape, a diameter $R_1$ of the protruded portion 13-2 can be set to be 100 μm, for example. A height $H_2$ of the protruded portion 13-2 can be set to be 50 μm, for example. Moreover, a protrusion amount E of the protruded portion 13-2 based on an upper surface 54A of the metal layer 54 can be set to be 48 μm, for example.

Figure 34:
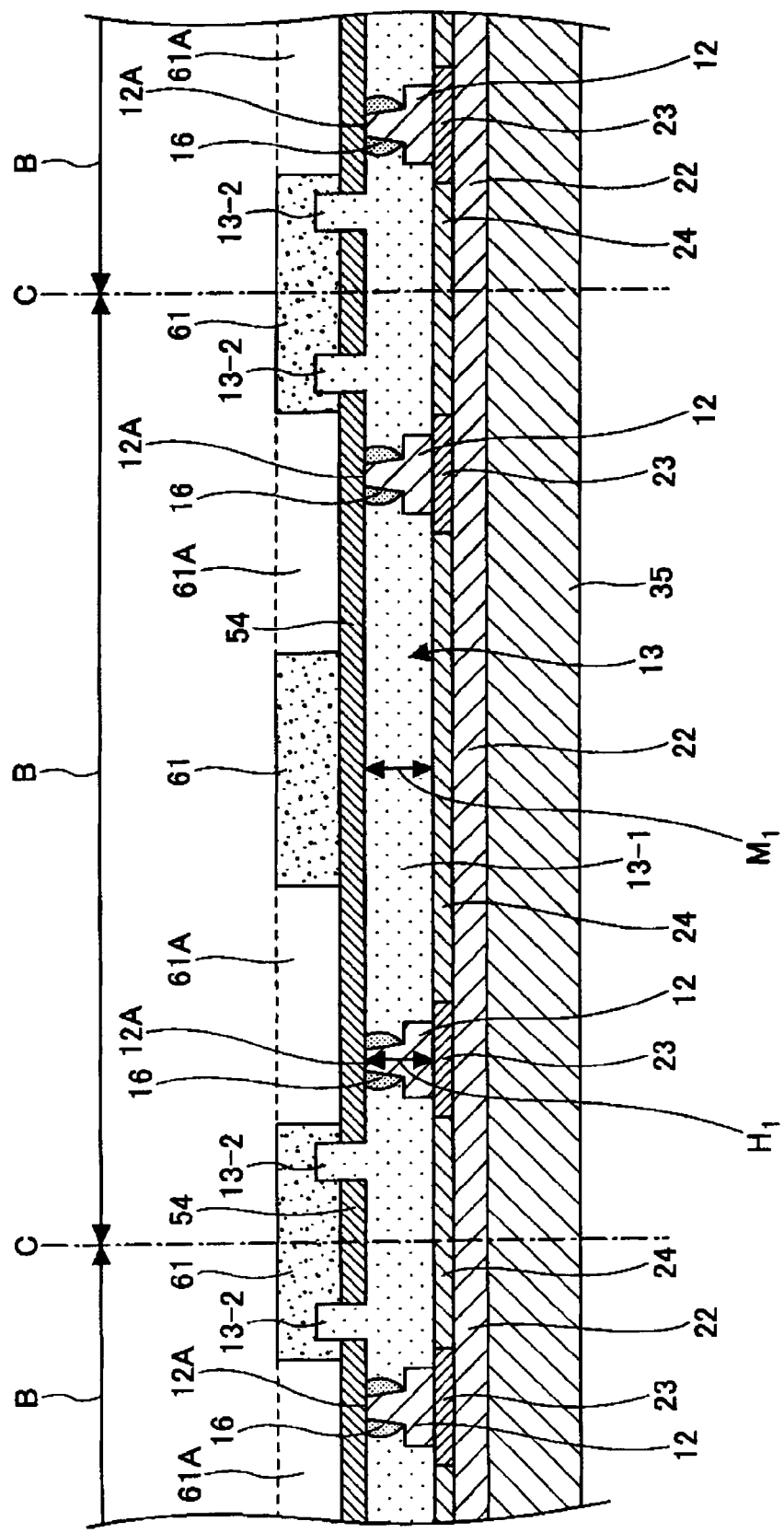
FIG. 34 is a view (No. 5) showing the step of manufacturing the semiconductor device according to the second embodiment of the invention.

At a step shown in FIG. 34, subsequently, the protruded portion 13-2 is used as an alignment mark to form, on a resin member 13 and the metal layer 54, a resist film 61 having an opening portion 61A in a corresponding part to the region in which the wiring pattern 51 is formed (more specifically, the region in which the plated film 55 to be one of components of the wiring pattern 51 is formed) (a resist film forming method). More specifically, in the case in which the resist film 61 is a positive resist, the resist film 61 having the opening portion 61A is formed by irradiating a light on a resist in the corresponding part to the region in which the wiring pattern 51 is formed to carry out an exposing treatment by using the protruded portion 13-2 to be the alignment mark through an inexpensive exposing device (not shown) including a CCD camera (not shown) when applying the resist and then performing the exposing treatment through an exposing device (not shown) and then executing a developing treatment over the resist obtained after the exposure. The resist film 61 is a mask for forming the plated film 55 on only the metal layer 54 in the corresponding part to the region in which the wiring pattern 51 is formed.

By using the protruded portion 13-2 as the alignment mark when executing the exposing treatment over the resist film 61 for patterning the metal layer 54 to be the base material of the wiring pattern 51, thus, it is possible to enhance precision in the position in which the opening portion 61A of the resist film 61 formed in the corresponding part to the region in which the wiring pattern 51 is formed (more specifically, the region in which the plated film 55 to be one of the components of the wiring pattern 51 is formed). Therefore, it is possible to enhance precision in the position in which the wiring pattern 51 is formed with respect to the internal connecting terminal 12.

When forming the resist film 61 serving as a mask for patterning the metal layer 54 to be the base material of the wiring pattern 51, furthermore, it is possible to detect the position of the protruded portion 13-2 serving as the alignment mark by using an inexpensive exposing device (not shown) including a CCD camera (not shown). Therefore, it is possible to reduce the manufacturing cost of the semiconductor device 50.

At a step shown in FIG. 35, subsequently, the plated film 55 is formed on the metal layer 54 in an exposed part to the opening portion 61A through an electrolytic plating method using the metal layer 54 as a feeding layer (a plated film forming step). For the plated film 55, it is possible to use a Cu plated film, for example. In the case in which the Cu plated film is used as the plated film 55, the plated film 55 can be set to have a thickness of 10 μm, for example.

At a step shown in FIG. 36, next, the resist film 61 shown in FIG. 35 is removed (a resist film removing step). At a step shown in FIG. 37, subsequently, the metal layer 54 in a portion in which the plated film 55 is not formed is removed, and the wiring pattern 51 constituted by the metal layer 54 and the plated film 55 is formed (a wiring pattern forming step).

Thereafter, the same processing as that of the steps shown in FIGS. 25 to 27 described in the first embodiment is carried out so that the semiconductor devices 50 are formed.

According to the method of manufacturing the semiconductor device in accordance with the embodiment, the protruded portion 13-2 is used as the alignment mark for carrying out the exposing treatment over the resist film 61 for patterning the metal layer 54 to be the base material of the wiring pattern 51. Consequently, it is possible to enhance precision in the position in which the opening portion 61A of the resist film 61 is formed in the corresponding part to the region in which the wiring pattern 51 is formed (more specifically, the region in which the plated film 55 to be one of the components of the wiring pattern 51 is formed). Therefore, it is possible to enhance the precision in the position in which the wiring pattern 51 is formed with respect to the internal connecting terminal 12.

When forming the resist film 61 serving as the mask for patterning the metal layer 54 to be the base material of the wiring pattern 51, moreover, it is possible to detect the position of the protruded portion 13-2 to be the alignment mark by using an inexpensive exposing device (not shown) including a CCD camera (not shown). Therefore, it is possible to reduce the manufacturing cost of the semiconductor device 50.

While the preferred embodiments according to the invention are described above in detail, the invention is not restricted to the specific embodiments but various changes and modifications can be made without departing from the scope of the invention described in the claims.

The invention can be applied to a method of manufacturing a semiconductor device including a semiconductor chip including an electrode pad, an internal connecting terminal provided on the electrode pad, and a wiring pattern which is electrically connected to the internal connecting terminal.

What is claimed is:

1. A method of manufacturing a semiconductor device comprising a plurality of semiconductor chips including an electrode pad, a semiconductor substrate having a plurality of semiconductor chip forming regions in which the semiconductor chips are formed, an internal connecting terminal provided on the electrode pad, and a wiring pattern which is electrically connected to the internal connecting terminal, the method comprising the steps of:

forming the internal connecting terminal on the electrode pads of the semiconductor chips;

preparing a support plate having a metal layer in which a metal layer to be a base material of the wiring pattern is provided on a support plate;

forming a penetrating portion on the support plate having a metal layer in a part opposite to the semiconductor chips;

forming a conductive terminal on the metal layer in a part opposite to the internal connecting terminal;

disposing the semiconductor chips and the support plate having a metal layer opposite to each other in such a manner that the internal connecting terminal and the conductive terminal are opposed to each other and pressing the support plate having a metal layer to pressure bond the internal connecting terminal to the metal layer;

sealing a portion between the semiconductor chips and the support plate having a metal layer and the penetrating portion with a resin after the pressure bonding step;

removing the support plate and forming a protruded portion on the resin in a part corresponding to the penetrating portion of the support plate after the sealing step;

forming a resist film covering the metal layer in a part corresponding to a region in which the wiring pattern is formed by using the protruded portion as an alignment mark; and etching the metal layer by using the resist film as a mask to form the wiring pattern.

2. The method of manufacturing a semiconductor device according to claim 1, wherein
at least two penetrating portions are formed in the penetrating portion forming step.

3. The method of manufacturing a semiconductor device according to claim 1, wherein
the penetrating portion is formed on the support plate having a metal layer in a part corresponding to a region other than the region in which the wiring pattern is formed in the penetrating portion forming step.

4. The method of manufacturing a semiconductor device according to claim 1, wherein
the penetrating portion formed on the support plate having a metal layer is used as the alignment mark to dispose the semiconductor chips and the support plate having a metal layer opposite to each other in the pressure bonding step.

5. The method of manufacturing a semiconductor device according to claim 1, wherein
the resin is formed by a transfer mold method in the sealing step.

6. A method of manufacturing a semiconductor device comprising a plurality of semiconductor chips including an electrode pad, a semiconductor substrate having a plurality of semiconductor chip forming regions in which the semiconductor chips are formed, an internal connecting terminal provided on the electrode pad, and a wiring pattern which is electrically connected to the internal connecting terminal, the method comprising the steps of:

forming the internal connecting terminal on the electrode pads of the semiconductor chips;

preparing a support plate having a metal layer in which the metal layer is provided on the support plate;

forming a penetrating portion on the support plate having a metal layer in a part opposite to the semiconductor chips;

forming a conductive terminal on the metal layer in a part opposite to the internal connecting terminal;

disposing the semiconductor chips and the support plate having a metal layer opposite to each other in such a manner that the internal connecting terminal and the conductive terminal are opposed to each other and pressing the support plate having a metal layer to pressure bond the internal connecting terminal to the metal layer;

sealing a portion between the semiconductor chips and the support plate having a metal layer and the penetrating portion with a resin after the pressure bonding step;

removing the support plate and forming a protruded portion on the resin in a part corresponding to the penetrating portion of the support plate after the sealing step;

forming a resist film having an opening portion in a part corresponding to a region in which the wiring pattern is formed on the metal layer by using the protruded portion as an alignment mark;

forming a plated film on the metal layer in an exposed part to the opening portion by an electrolytic plating method using the metal layer as a feeding layer;

removing the resist film after the plated film forming step; and removing the metal layer in a part in which the plated film is not formed to form the wiring pattern constituted by the metal layer and the plated film.

7. The method of manufacturing a semiconductor device according to claim 6, wherein at least two penetrating portions are formed in the penetrating portion forming step.

8. The method of manufacturing a semiconductor device according to claim 6, wherein the penetrating portion is formed on the support plate having a metal layer in a part corresponding to a region other than the region in which the wiring pattern is formed in the penetrating portion forming step.

9. The method of manufacturing a semiconductor device according to claim 6, wherein the penetrating portion formed on the support plate having a metal layer is used as the alignment mark to dispose the semiconductor chips and the support plate having a metal layer opposite to each other in the pressure bonding step.

10. The method of manufacturing a semiconductor device according to claim 6, wherein the resin is formed by a transfer mold method in the sealing step.

* * * * *